United States Patent [19]
Ban et al.

[11] Patent Number: 6,071,802
[45] Date of Patent: Jun. 6, 2000

[54] METHOD FOR MANUFACTURING SEMICONDUCTOR DEVICE HAVING SELF-ALIGNED CONTACT

[75] Inventors: Hyo-dong Ban, Kyungki-do; Hyun-cheol Choe, Seoul; Chang-sik Choi, Kyungki-do, all of Rep. of Korea

[73] Assignee: Samsung Electronics Co., Ltd., Rep. of Korea

[21] Appl. No.: 08/961,453

[22] Filed: Oct. 30, 1997

[30] Foreign Application Priority Data

Oct. 30, 1996 [KR] Rep. of Korea ............ 96-50492
Dec. 20, 1996 [KR] Rep. of Korea ............ 96-69320

[51] Int. Cl.⁷ ............................................ H01L 21/4763
[52] U.S. Cl. ........................ 438/618; 438/637; 438/631
[58] Field of Search ............................ 438/577, 618, 438/637, 631, 657

[56] References Cited

U.S. PATENT DOCUMENTS

| | | |
|---|---|---|
| 5,292,677 | 3/1994 | Dennison . |
| 5,296,400 | 3/1994 | Park et al. ........................ 437/52 |
| 5,312,769 | 5/1994 | Matsuo et al. ................... 437/52 |
| 5,387,532 | 2/1995 | Hamamoto et al. ............. 437/52 |
| 5,550,071 | 8/1996 | Ryou ................................ 437/41 |
| 5,858,865 | 1/1999 | Juengling et al. . | |

FOREIGN PATENT DOCUMENTS 61-156883  7/1986  Japan .

*Primary Examiner*—Caridad Everhart
*Attorney, Agent, or Firm*—Myers Bigel Sibley & Sajovec

[57] ABSTRACT

A method for manufacturing a semiconductor memory device in which a bit line and a storage electrode of a capacitor are connected to an active area of a semiconductor substrate, respectively, via a contact pad formed in a self-aligning manner. The method includes the steps of forming gate electrodes on the semiconductor substrate, the gate electrodes being covered with a nitride spacer. Then, a thermal oxide layer is formed on the exposed surface of the semiconductor substrate between the gate electrodes. Then, an etch stop layer is formed on the entire surface of the resultant structure having the thermal oxide layer to an appropriate thickness such that the space between the gate electrodes is not buried. Then, a first interlayer dielectric (ILD) film covering the space between the gate electrodes and the top of the gate electrodes is formed, and the first ILD film is then patterned to form a landing pad hole which exposes the spacer and the etch stop layer. Then, the etch stop layer and the thermal oxide layer are removed to expose the surface of the semiconductor substrate, and the landing pad hole is then filled with a conductive material to form landing pads.

34 Claims, 25 Drawing Sheets

CELL ARRAY REGION

PERIPHERAL CIRCUIT REGION

CELL ARRAY REGION

PERIPHERAL CIRCUIT REGION

CELL ARRAY REGION

PERIPHERAL CIRCUIT REGION

CELL ARRAY REGION

PERIPHERAL CIRCUIT REGION

CELL ARRAY REGION

PERIPHERAL CIRCUIT REGION

CELL ARRAY REGION

PERIPHERAL CIRCUIT REGION

CELL ARRAY REGION

PERIPHERAL CIRCUIT REGION

6,071,802

METHOD FOR MANUFACTURING SEMICONDUCTOR DEVICE HAVING SELF-ALIGNED CONTACT

BACKGROUND OF THE INVENTION

1. Field of the Invention

The present invention relates to a semiconductor device manufacturing method, and more particularly, to a method for manufacturing a semiconductor memory device having a contact.

2. Description of the Related Art

In general, as the dynamic random access memory (DRAM) becomes more highly integrated, the size of a cell gradually decreases, thereby decreasing the process margin in manufacturing a semiconductor device. Thus, precision in the alignment in forming a contact in the cell becomes more important.

In a DRAM, a contact in a cell array portion, particularly, a contact for connecting a storage electrode of a capacitor to a semiconductor substrate is usually formed between a bit line and a gate electrode line. Thus, securing an alignment margin to form a contact in such condition directly affects the performance therefor of the device.

Also, a semiconductor memory device of 64M DRAM or more adopts a capacitor on bit-line (COB) structure, which results in an increase of a step difference between a cell array region and a peripheral circuit region. Accordingly, it is very difficult to secure an appropriate focus margin and form a fine pattern.

SUMMARY OF THE INVENTION

To solve the above problems, it is an object of the present invention to provide a method for manufacturing a semiconductor device having a self-aligning contact, by which a large enough alignment margin can be secured.

It is another object of the present invention to provide a semiconductor memory device manufacturing method capable of reducing the step difference between a cell array region and a peripheral region.

Accordingly, to achieve the above objects, there is provided a method for manufacturing a semiconductor device comprising the steps of forming gate electrodes on a semiconductor substrate, the gate electrodes being covered with a nitride spacer. Then, a thermal oxide layer is formed on the exposed surface of the semiconductor substrate between the gate electrodes, and an etch stop layer is then formed on the entire surface of the resultant structure having the thermal oxide layer to an appropriate thickness such that the space between the gate electrodes is not buried. Then, a first interlayer dielectric (ILD) film covering the space is formed between the gate electrodes and the top of the gate electrodes, and the first ILD film is then patterned to form a landing pad hole which exposes the spacer and the etch stop layer. Then, the etch stop layer and the thermal oxide layer are removed to expose the surface of the semiconductor substrate, and then the landing pad hole is filled with a conductive material to form a contact plug, resulting in landing pads.

Preferably, to form the landing pad hole, a first conductive layer is formed on the entire surface of the resultant structure having the landing pad hole, and the first conductive layer is etched until the surface of the first ILD film is exposed, to form the contact plug in the landing pad hole. Here, the first conductive layer is preferably formed by a chemical mechanical polishing (CMP) method or by etching back the first conductive layer.

Preferably, after forming the landing pads, the method for manufacturing the semiconductor device further comprises the steps of forming a second ILD film on the resultant structure having the landing pads. Then, the second ILD film is patterned to form a bit line contact hole which exposes the surface of a part of the lancing pads, and a bit line contact plug is then formed in the hit line contact hole. Then, a bit line which is connected to the bit line contact plug is formed on the resultant structure having the bit line contact plug.

Also, preferably, after the step of forming the bit line, the manufacturing method further comprises the steps of forming a third ILD film on the resultant structure having the bit line. Then, the third ILD film is patterned to form a storage electrode contact hole which exposes the surface of the other part of the landing pads, and a storage electrode is then formed, which is connected to the semiconductor substrate via the storage electrode contact hole and the other part of the landing pads. Then, a dielectric film is formed on the storage electrode, and then an upper electrode is formed on the dielectric layer to complete a capacitor.

According to another aspect of the present invention, there is provided a method for manufacturing a semiconductor memory device comprising the steps of forcing a gate electrode on a semiconductor substrate having a cell array region and a peripheral circuit region, the gate electrode being covered with a spacer. Then, a planarized first interlayer dielectric (ILD) film is formed on the semiconductor substrate having the gate electrode, and a second ILD film is then formed on the first ILD film. Then, a remaining preventing layer is formed on the second ILD film, and the remaining preventing layer, the second ILD film and the first ILD film are patterned in sequence to form a landing pad hole which simultaneously exposes an active region of the semiconductor substrate, and a part of the spacer in the cell array region. Then, a contact plug is formed in the landing pad hole, resulting in landing pads.

According to still another aspect of the present invention, there is provided a method for manufacturing a semiconductor device comprising the steps of forming gate electrodes on a semiconductor substrate, the gate electrodes being covered with a nitride spacer. Then, a thermal oxide layer is formed on the surface of the semiconductor substrate which is exposed between the gate electrodes. Then, an etch stop layer is formed on the entire surface of the resultant structure having the thermal oxide layer to an appropriate thickness such that the space between the gate electrodes is not buried. Then, a first oxide layer is formed in the space between the gate electrodes, and then a second oxide layer is formed on the first oxide layer. Then, a polysilicon layer is formed on the second oxide layer, and the polysilicon layer, the second oxide layer, the first oxide layer, the etch stop layer and the thermal oxide layer are partially etched in sequence, to form a landing pad hole which simultaneously exposes the surface of the semiconductor substrate and a part of the spacer. Then, a landing pad is formed in the landing pad hole.

In the method for manufacturing a semiconductor device according to the present invention, a sufficient alignment margin can be secured in the formation of a landing pad without damaging the semiconductor substrate, and the step difference in the semiconductor substrate can be minimized.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

In a semiconductor memory device manufacturing method according to the present invention, a bit line and a storage electrode of a capacitor are connected to an active region of a semiconductor substrate via self-aligned landing pads.

Figure 1:
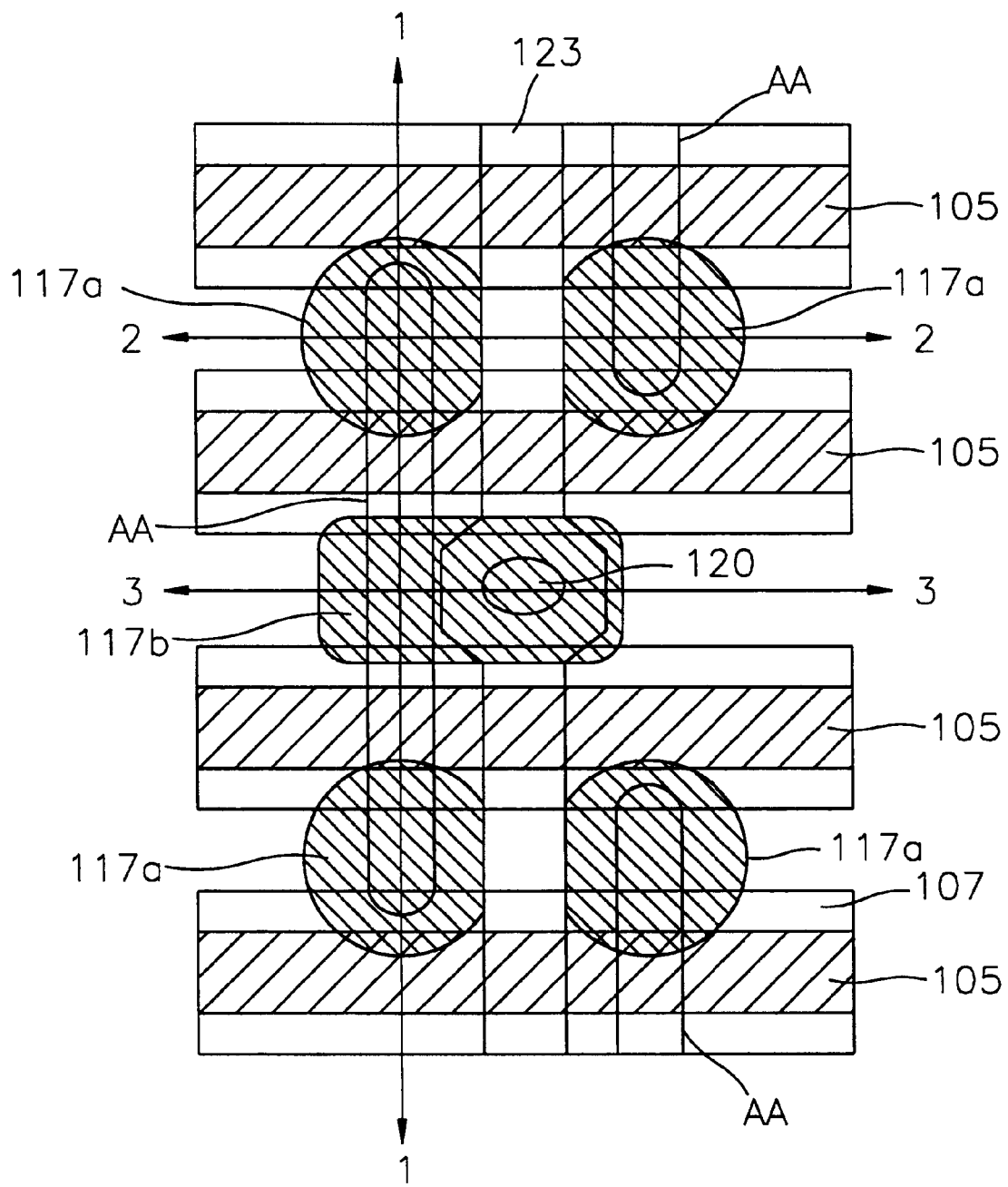
FIG. 1 shows the layout of a cell array region of a semiconductor memory device manufactured by a method according to a first embodiment of the present invention.

FIG. 1 shows the layout of a cell array region of a semiconductor memory device manufactured by a method according to the first embodiment of the present invention. FIG. 1 shows the state where landing pads 117a and 117b are formed on a gate electrode 105 in a self-aligning manner, and the formation of a bit line thereon is completed.

In FIG. 1, reference character "AA" represents an active region, reference numeral 105 represents a gate electrode, reference numeral 107 represents a spacer for capping the gate electrode 105, reference numeral 117a represents a landing pad for connecting a storage electrode of a capacitor to a semiconductor substrate, reference numeral 117b represents a landing pad for connecting the bit line to the semiconductor substrate. Also, reference numeral 120 represents a bit line contact hole, and reference numeral 123 represents a bit line.

Next, the semiconductor memory device manufacturing method according to the first embodiment of the present invention will be described in detail with reference to FIG. 1 and, FIGS. 2 through 14.

Figure 2A:
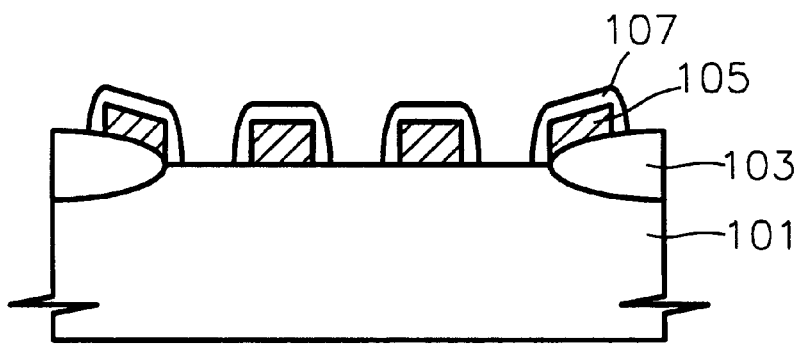
FIGS. 2a through 14c are section views illustrating the semiconductor memory device manufacturing method according to the first embodiment of the present invention.
Figure 2B:
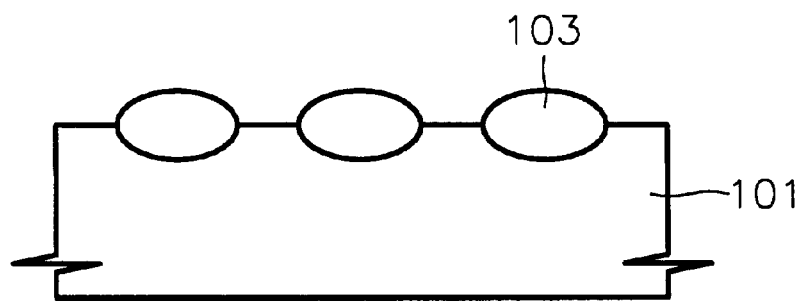
Figure 2C:
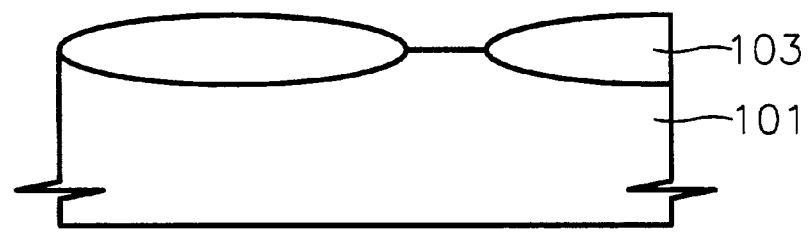
Figure 3A:
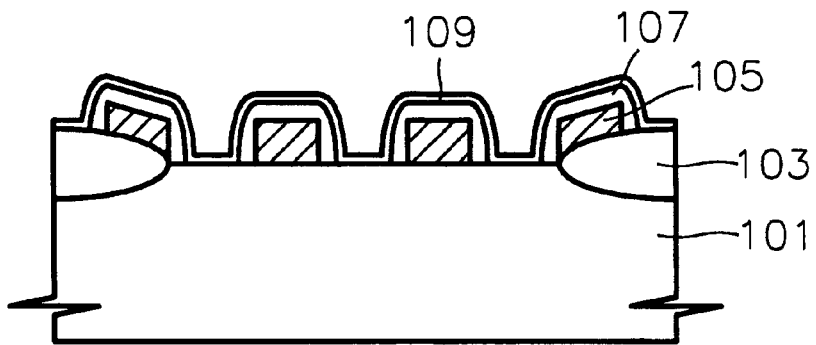
Figure 3B:
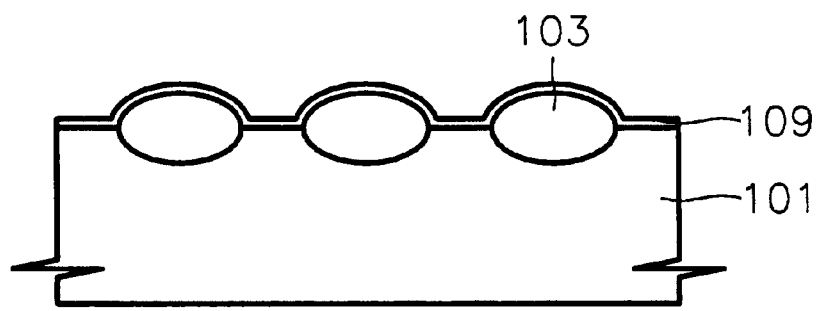
Figure 3C:
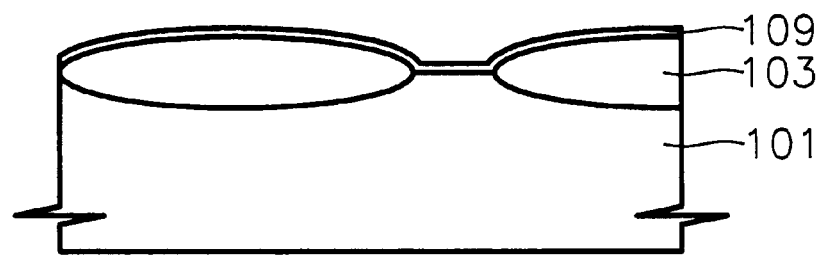

FIGS. 2a, 3a, . . . , 14a are section views cut along line 1—1 of FIG. 1, FIGS. 2a, 2b, . . . , 14b are section views cut along line 2—2 of FIG. 1, and FIGS. 2c, 3c, . . . , 14c are section views cut along line 3—3 of FIG. 1.

Referring to FIGS. 2a, 2b and 2c, a gate electrode 105 and a spacer 107 for capping the gate electrode 105, e.g., a silicon nitride spacer, are formed in sequence on a semiconductor substrate 101 in which an active region and a non-active region are divided by an isolation film 103 such as a field oxide layer. Then, a source/drain (not shown) is formed in the active region between the gate electrodes 105 by an ion implantation process, thereby completing a transistor consisting of the gate electrode 105 and the source/drain.

Then, in order to protect the surface of the active region of the semiconductor substrate 101 which is exposed during the formation of the transistor from an etch stop layer formed of a nitride layer, to be formed in a subsequent step, a thermal oxide layer (not shown) is formed on the semiconductor substrate 101 to a thickness of approximately 50–150 Å. If the thickness of the thermal oxide layer exceeds the above range, the thermal oxide layer should be partially etched when etching the silicon nitride layer as an etch stop layer in a subsequent step. Here, a field oxide layer may be etched together, so that the thermal oxide layer can be grown to a minimum thickness.

Referring to FIGS. 3a, 3b and 3c, an etch stop layer 109 made of silicon nitride is formed on the entire surface of the resultant structure having the thermal oxide layer to a thickness of at least 100 Å. In consideration of the etching selectivity of the etch stop layer 109 to an oxide layer, the etch stop layer 109 is formed to the optimum thickness, to at least 100 Å, such that the space between the gate electrodes 105 is not buried.

Figure 4A:
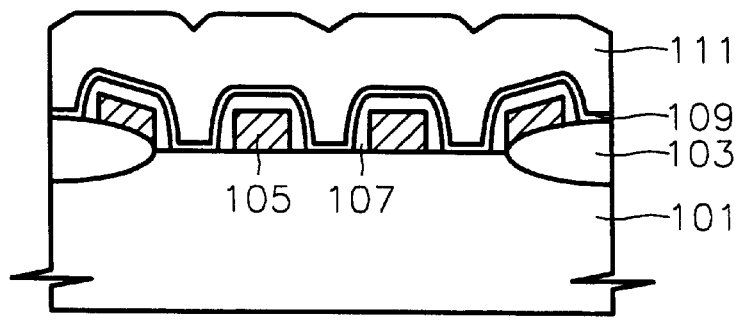
Figure 4B:
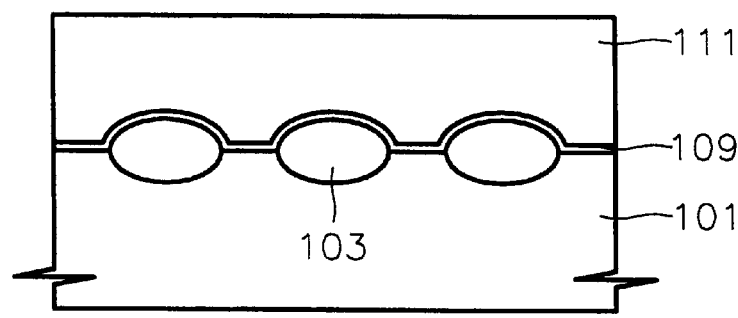
Figure 4C:
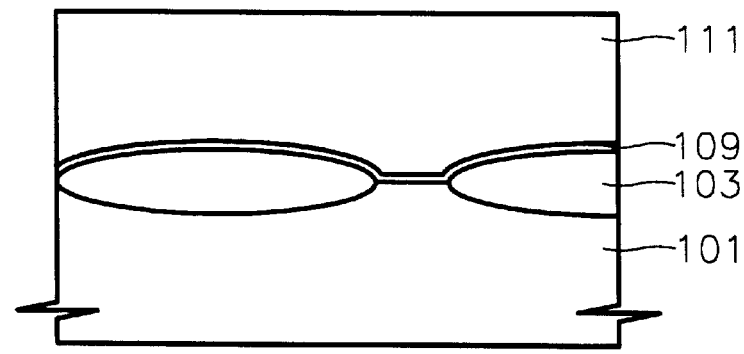

Referring to FIGS. 4a, 4b and 4c, a first oxide layer 111 is formed on the resultant structure having the etch stop layer 109 to a thickness that is sufficient to completely bury the space between the gate electrodes 105.

Figure 5A:
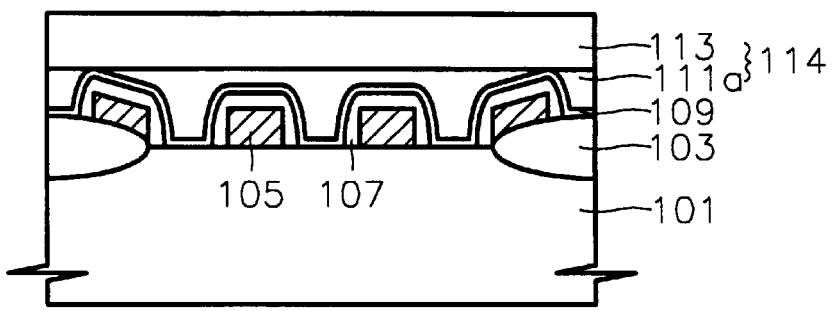
Figure 5B:
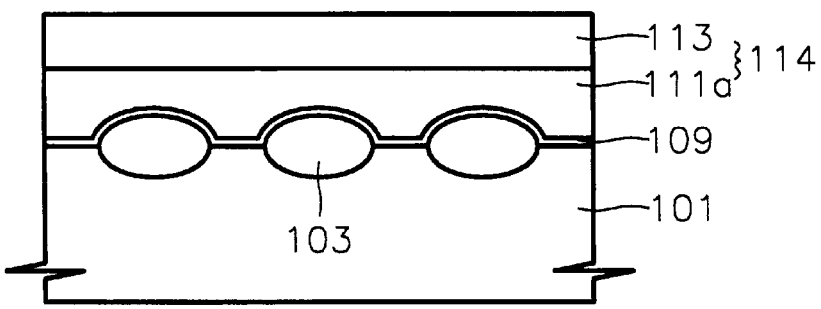
Figure 5C:
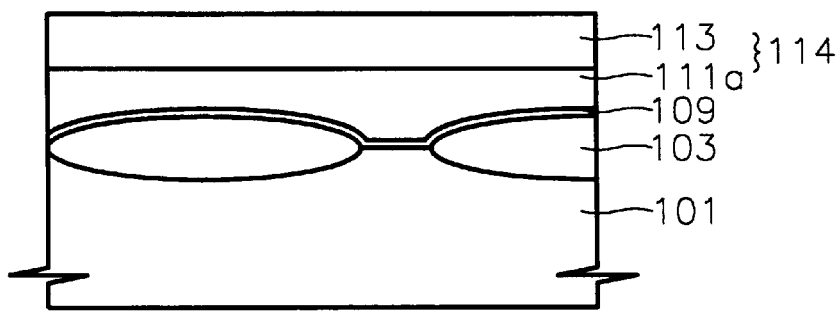

Referring to FIGS. 5a, 5b and 5c, the first oxide layer 111 is planarized by a chemical mechanical polishing (CMP) process, using the etch stop layer 109 as an etching end point, thereby resulting in a planarized first oxide layer 111a. Then, a second oxide layer 113, e.g., an oxide layer formed by chemical vapor deposition (CVD), is formed on the planarized first oxide layer 111a to a predetermined thickness, to form a first interlayer dielectric (ILD) film 114 consisting of the first oxide layer 111a and the second oxide layer 113. Here, the thickness of the second oxide layer 113 is controlled such that the thickness of the first ILD film 114 be the same as that of landing pads to be formed in a subsequent step.

Figure 6A:
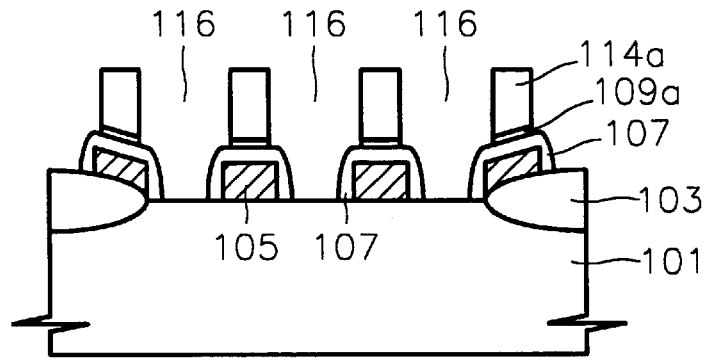
Figure 6B:
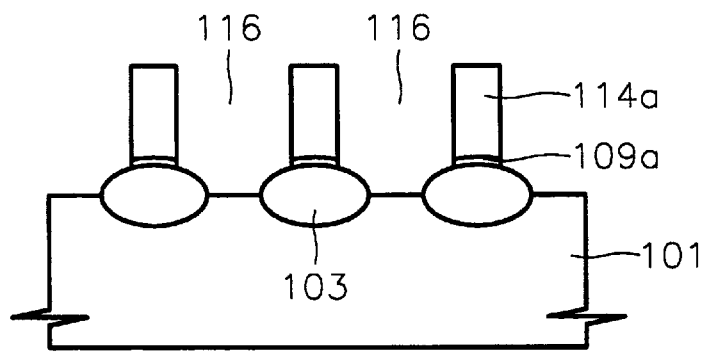
Figure 6C:
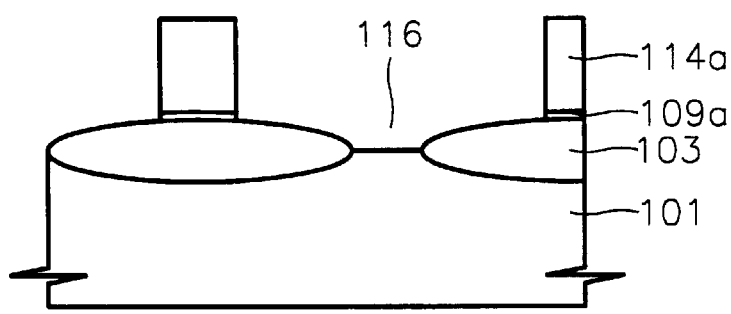

Referring to FIGS. 6a, 6b and 6c, the first ILD film 114 and the etch stop layer 109 are patterned by photolithography, to form a first ILD film pattern 114a. At this time, a landing pad hole 116 is also formed, which exposes the spacer 107 covering the gate electrode 105 and the etch stop layer 109 formed on the semiconductor substrate 101. Then, the exposed thermal oxide layer (not shown) is removed by dry or wet etching so that the surface of the semiconductor substrate 101 is exposed by the landing pad hole 116.

Figure 7A:
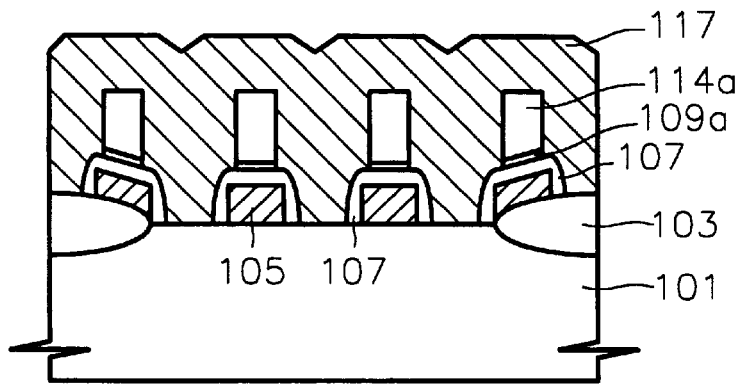
Figure 7B:
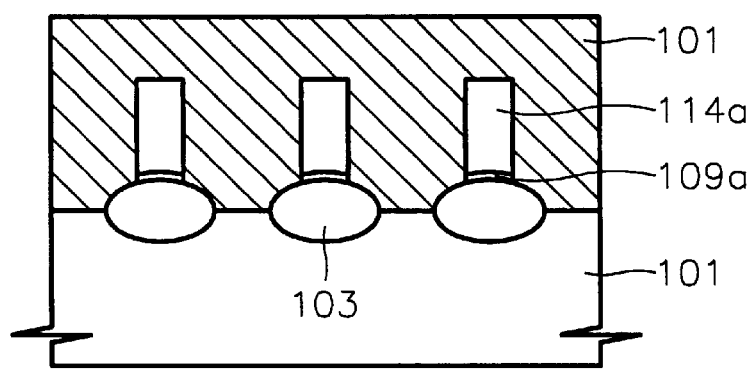
Figure 7C:
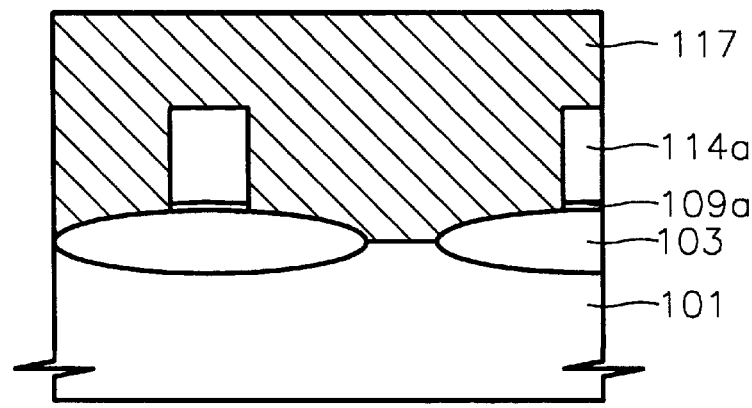

Referring to FIGS. 7a, 7b and 7c, a first conductive layer 117, e.g., an impurity-doped polysilicon layer, is formed in the landing pad hole 116 and on the first ILD pattern 114a.

Figure 8A:
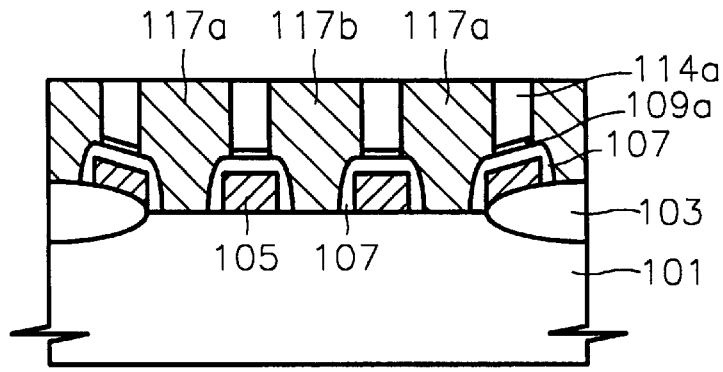
Figure 8B:
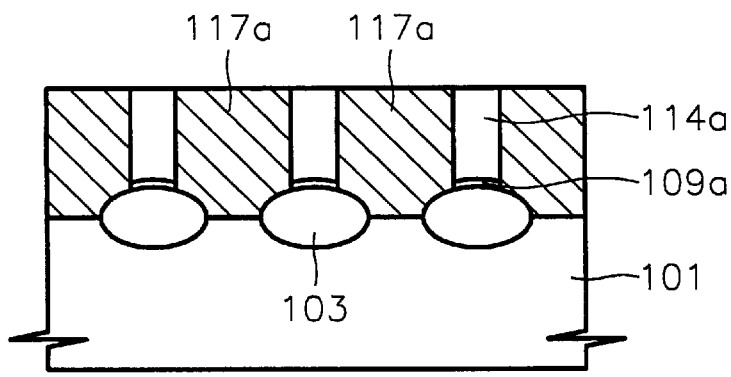
Figure 8C:
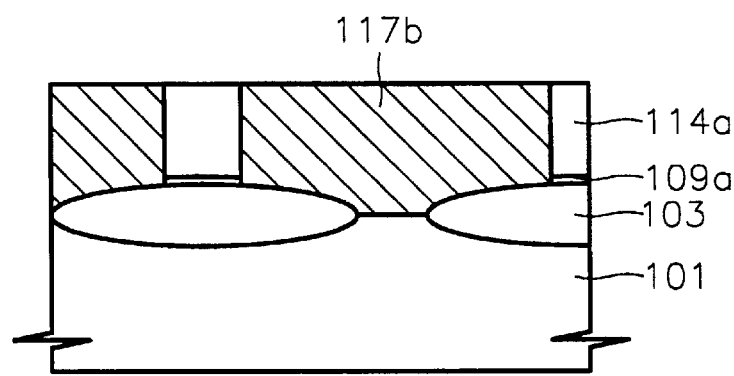

Referring to FIGS. 8a, 8b and 8c, the first conductive layer 117 is etched by CMP or an etch back process until the surface of the first ILD pattern 114a is exposed, thereby forming landing pads 117a and 117b in the landing pad holes 116.

According to a conventional semiconductor memory device manufacturing method, a conductive material, e.g., impurity-doped polysilicon, is deposited on the semiconductor substrate, and then patterned such that a portion in which a pad is to be formed remains. On the contrary, according to the method of the present invention, the landing pad hole 116 is first formed, and then the first conductive layer 117 is deposited and planarized, resulting in self-aligned landing pads 117a and 117b. Thus, there is no step difference between a cell array region and a peripheral circuit region while the landing pads 117a and 117b are formed. Also, the first ILD film 114 made of an oxide having a high etching selectivity to the semiconductor substrate 101 is etched so that damage to the semiconductor substrate can be prevented even though it may be mis-aligned. Also, when etching the first conductive layer 117 by a CMP process to form the landing pads 117a and 117b, the surface of the semiconductor substrate is precisely planarized after the landing pads 117a and 117b are formed. Thus, when forming an ILD film on the surface of the semiconductor substrate, the ILD film can be formed by only a deposition step, without a need for a step of reflowing insulation material such as borophosphosilicate glass (BPSG) or an additional planarizing step.

Figure 9A:
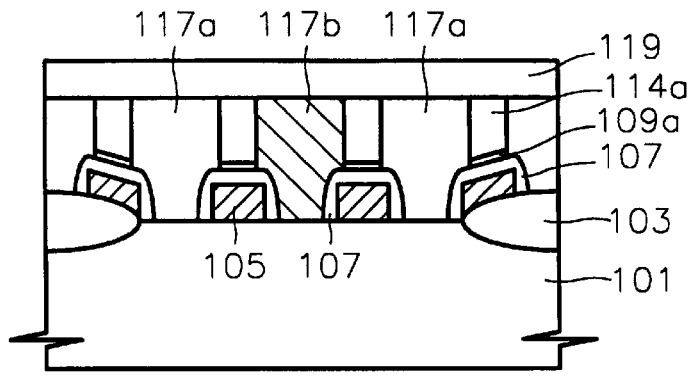
Figure 9B:
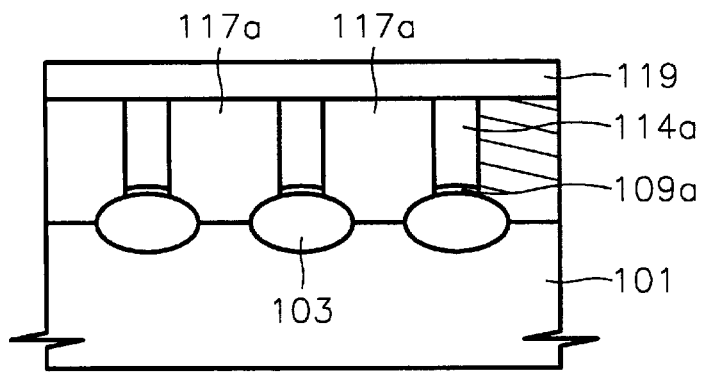
Figure 9C:
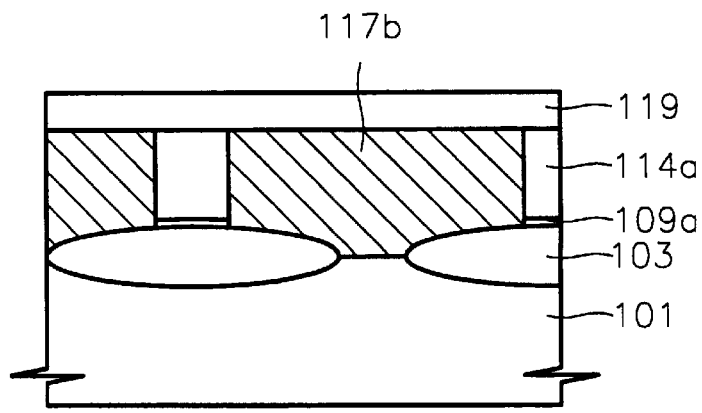

Referring to FIGS. 9a, 9b and 9c, a second ILD film 119, e.g., an oxide layer such as BPSG, is deposited to a thickness of approximately 500~3,000 Å on the resultant structure having the landing pads 117a and 117b. In the present invention, the landing pads 117a and 117b are formed by the above-described patterning method, so that there is no need for an extra step for planarizing the insulation film.

Figure 10A:
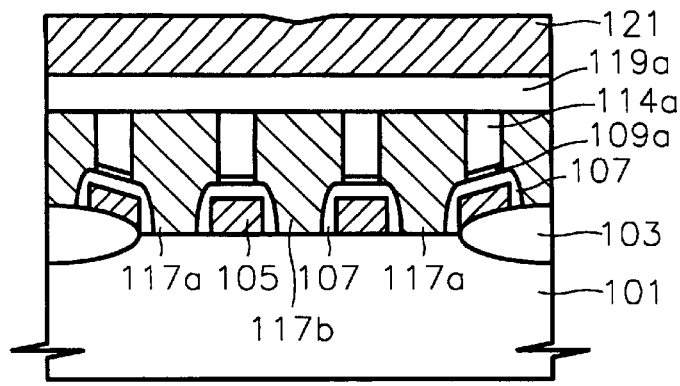
Figure 10B:
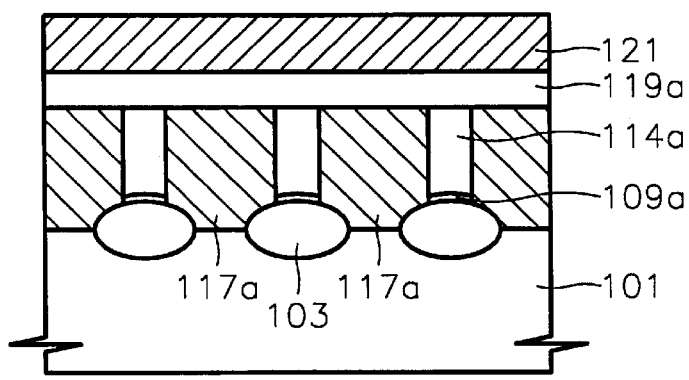
Figure 10C:
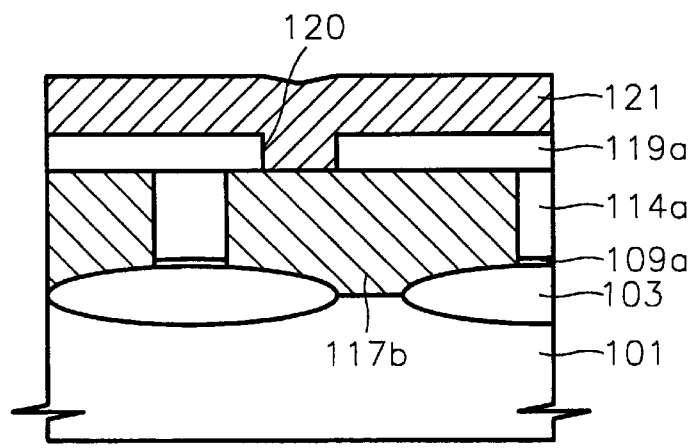

Referring to FIGS. 10a, 10b and 10c, the second ILD film 119 is patterned to form a second ILD film pattern 119a having a bit line contact hole 120 which exposes the landing pad 117b connected to the drain in the cell array region of the semiconductor substrate 101, and a landing pad connected to the active region and a landing pad connected to the gate electrode in the peripheral circuit region. Then, a second conductive layer, e.g., an impurity-doped polysilicon layer, is formed on the entire surface of the resultant structure, to a thickness sufficient to bury the bit line contact hole 120.

Figure 11A:
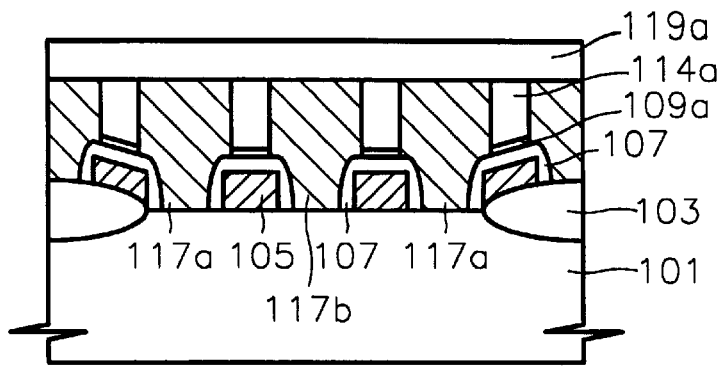
Figure 11B:
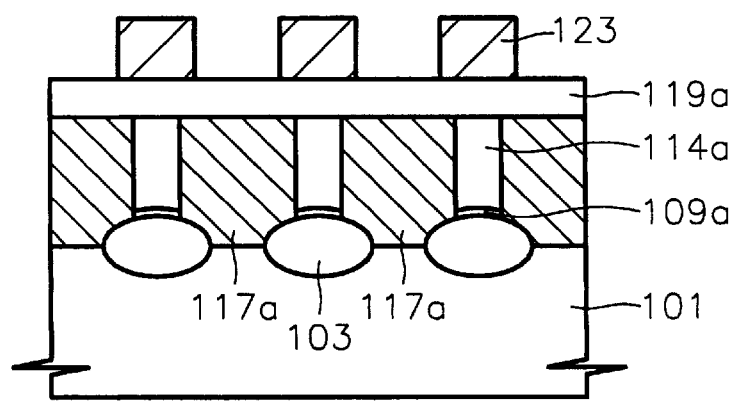
Figure 11C:
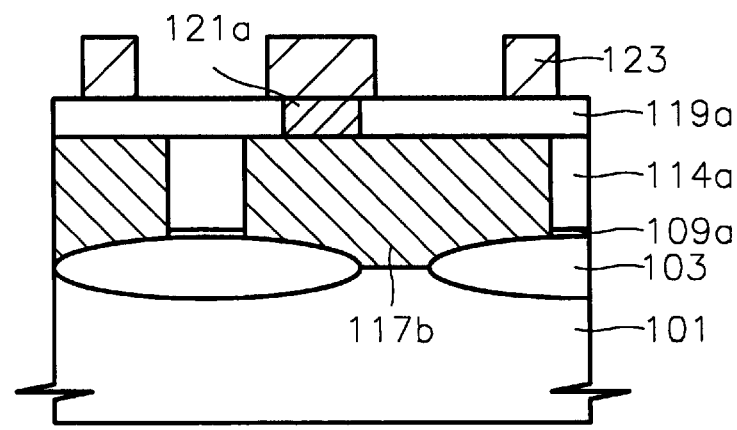

Referring to FIGS. 11a, 11b and 11c, the second conductive layer 121 is etched by a CMP process or an etch back process until the second ILD film pattern 119a is exposed, thereby forming a bit line contact plug 121a. Then, a third conductive layer, e.g., an amorphous tungsten silicide (WSi$_x$) layer, is formed by a CVD process or a physical vapor deposition method, and then patterned to form a bit line 123. As a result, the step difference corresponding to the thickness of the bit line 123, which is less than that of the conventional case, exists on the semiconductor substrate 101.

The reason for depositing the tungsten silicide forming the bit line 123 in an amorphous state is to free the same from stress in a subsequent thermal process. That is, if a crystallized tungsten silicide is deposited, lifting occurs in the interface with the upper layer due to stress in a high-temperature thermal process performed at 600° C. or higher.

Figure 12A:
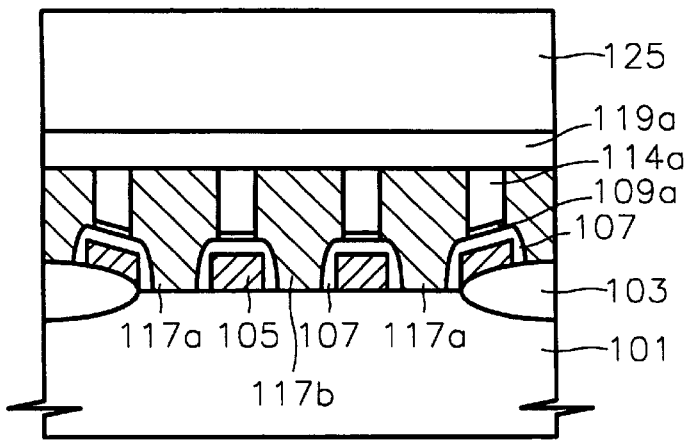
Figure 12B:
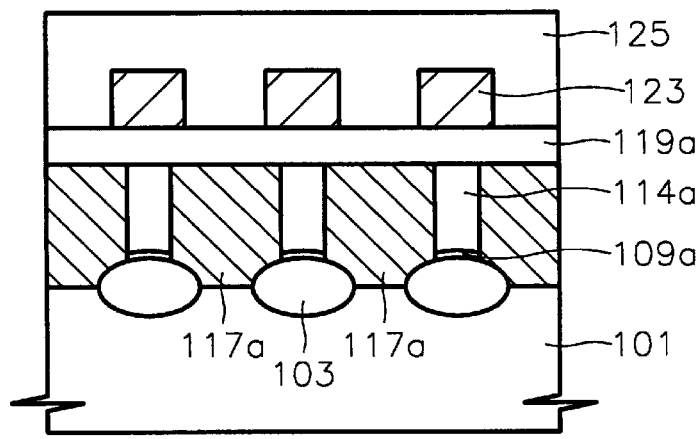
Figure 12C:
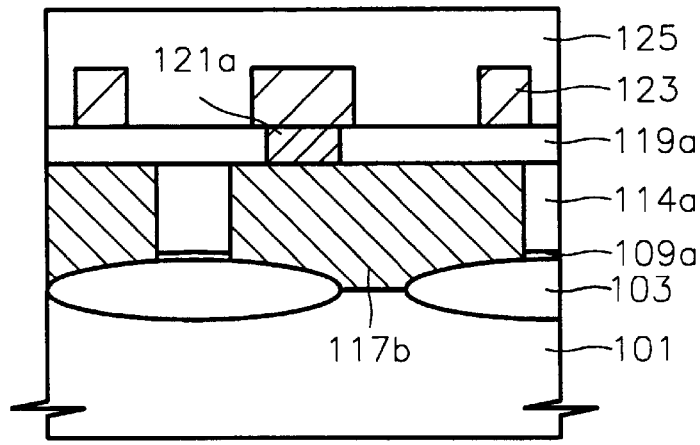

Referring to FIGS. 12a, 12b and 12c, a third ILD film 125 is formed on the entire surface of the semiconductor substrate 101 having the bit line 123. The third ILD film 125 is formed of an oxide layer which can be deposited at a lower temperature, i.e., at 500° C. or less, that is, a low-temperature oxide layer. As a method for forming the third ILD film 125, there is a method for forming an O$_3$-tetraethyl ortho silicate (TEOS) undoped silicate glass (USG) layer by an atmosphere pressure chemical vapor deposition (APCVD) method. As another method, a plasma type oxide layer may be deposited on the semiconductor substrate 101 having the bit line 123 to a thickenss of 100~2,000 Å, and BPSG is then deposited on the plasma type oxide layer, and then reflowing is performed. Here, the second method requires an additional planarization step since the plasma type oxide layer without flow characteristics is used. However, in the first method using an O$_3$-TEOS USG layer, a good planarized layer can be formed even though the thickness of the deposited layer is 3,500 Å or less due to its excellent filling characteristics so that an additional process such as flowing is unnecessary. The amorphous tungsten silicide is crystallized via a phase shift at near 600° C., thereby increasing stress. Thus, when the third ILD film 125 is composed of a low-temperature oxide layer which is formed at a lower temperature of 500° C., the lifting phenomenon in the interface between the tungsten silicide layer and the upper layer thereof can be prevented.

Figure 13A:
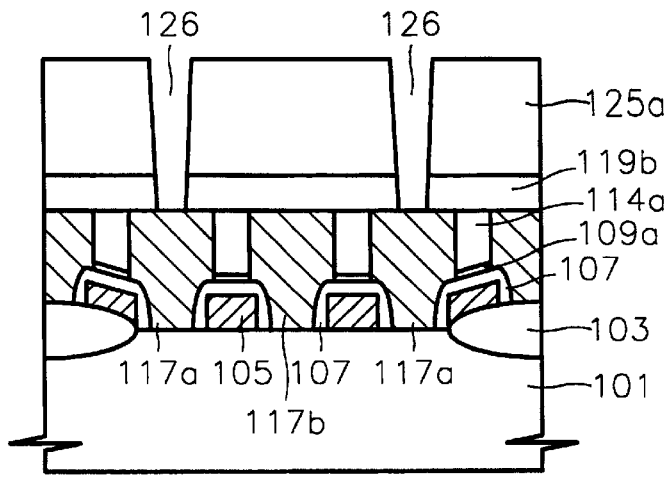
Figure 13B:
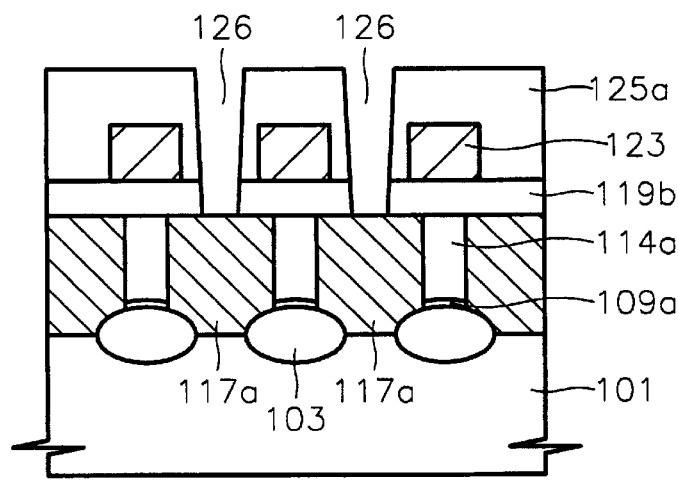
Figure 13C:
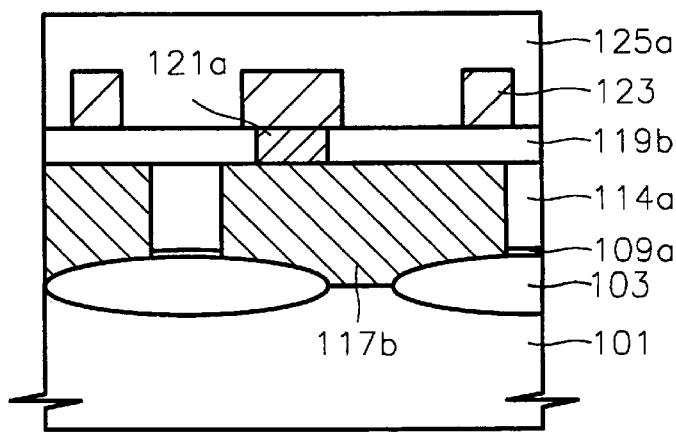

Referring to FIGS. 13a, 13b and 13c, the third ILD film 125 and the second ILD film pattern 119a are patterned to form a third ILD film pattern 125a and the second ILD film pattern 119b, resulting in a storage electrode contact hole 126 which exposes the surface of the landing pad 117a connected to the source of the transistor.

Figure 14A:
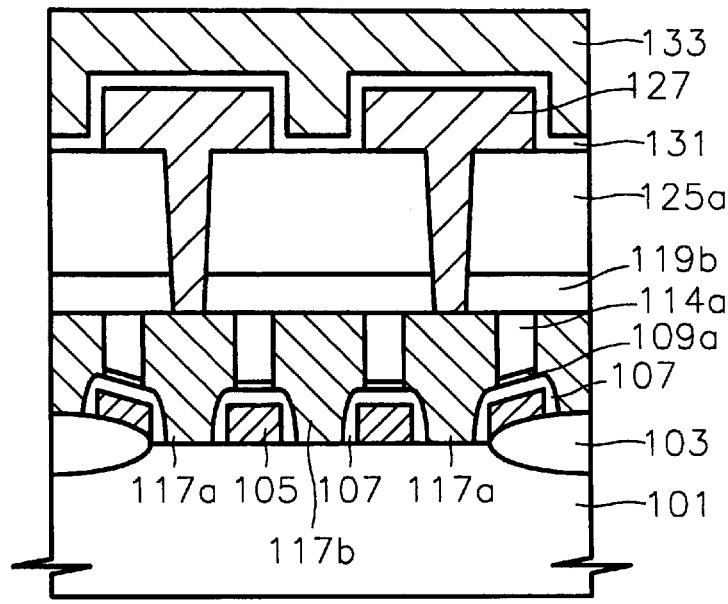
Figure 14B:
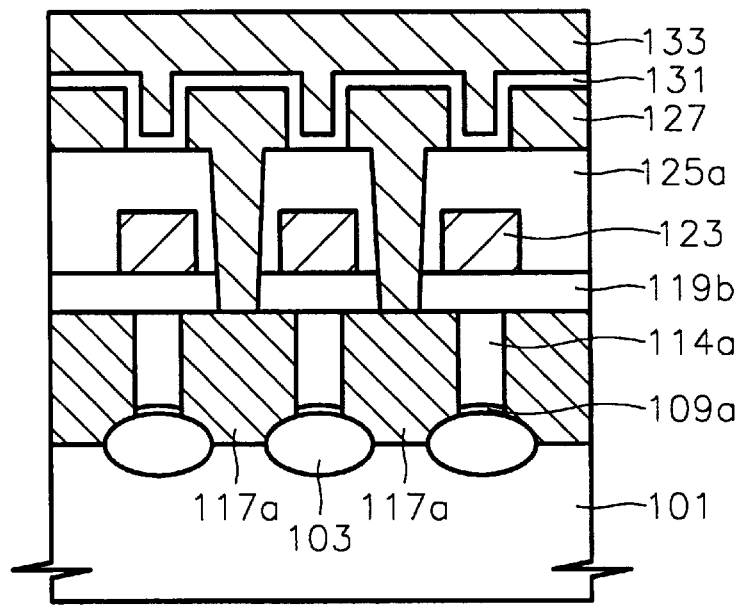
Figure 14C:
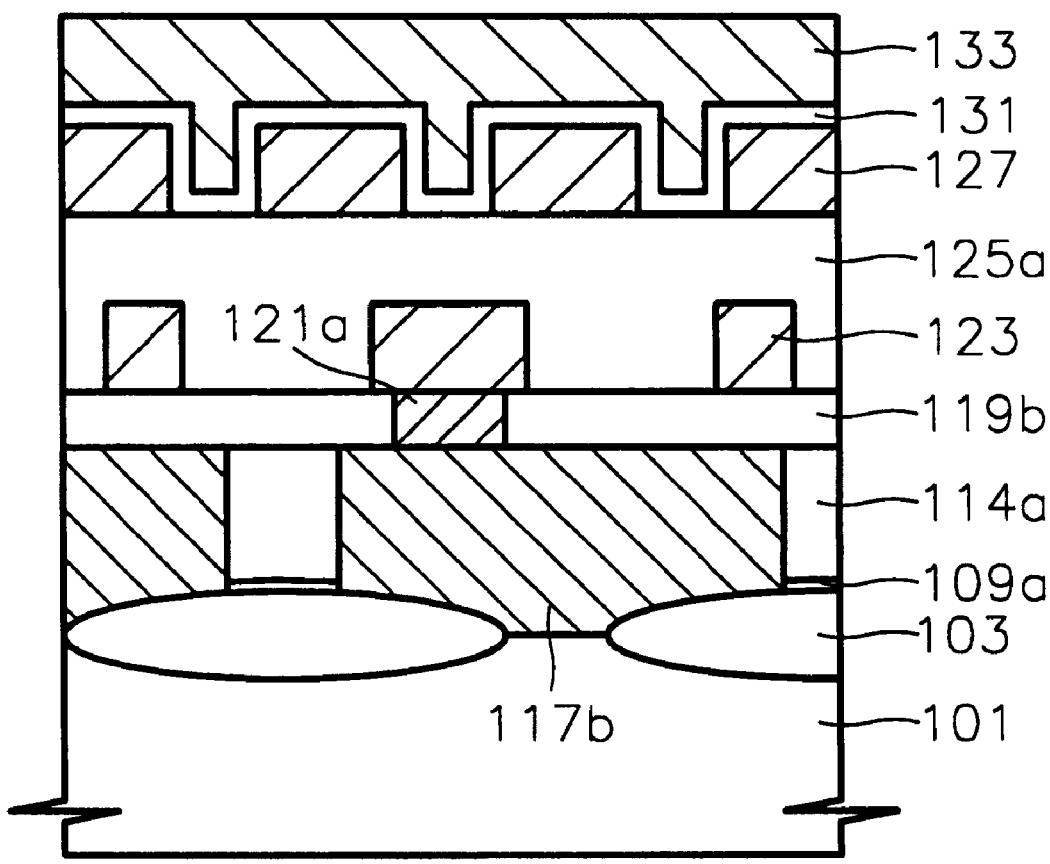

Referring to FIGS. 14a, 14b and 14c, a fourth conductive layer, i.e., an impurity-doped polysilicon layer, is formed on the entire surface of the resultant structure having the storage electrode contact hole 126, and then patterned to form a storage electrode 127. As a result, a step difference corresponding to only the thickness of the storage electrode 127 exists on the semiconductor substrate 101.

Then, a dielectric film 131 and a plate electrode 133 are sequentially formed on the storage electrode 127, completing a capacitor. Here, a nitride layer is forced on the storage electrode 127 prior to the formation of the dielectric layer 131. Then, the resultant structure is heated to approximately 750° C. under a nitrogen atmosphere, and then an oxidation process is performed on the resultant structure when the temperature exceeds 750° C., thereby forming the dielectric film 131 having a nitride/oxide structure. When the dielectric film 131 is formed by the above method, oxidation of the bit line 123 during an oxidation process can be prevented.

As described above, in the semiconductor memory device manufacturing method according to the present invention, a patterning method is used for forming the landing pad, and the bit line is formed after the bit line contact pad is formed so that the step difference on the semiconductor substrate can be minimized and the semiconductor substrate can be planarized by a simpler process. As a result, the step difference between the cell array region and the peripheral circuit region are decreased to the thickness of the storage electrode.

Next, a semiconductor memory device manufacturing method according to the second embodiment of the present invention will be described.

In the second embodiment, a method capable of solving the problem of a dishing phenomenon is provided. Dishing may occur in a peripheral circuit region when the conductive layer deposited on a portion other than the inside of the landing pad hole is etched by a CMP method.

FIGS. 15a and 15b through FIGS. 21a and 21b are section views illustrating a semiconductor memory device manufacturing method according to the second embodiment of the present invention. Here, FIGS. 15a, 16a, . . . , 21a show a cell array region, and FIGS. 15b, 16b, . . . , 21b show a peripheral circuit region.

Figure 15A:
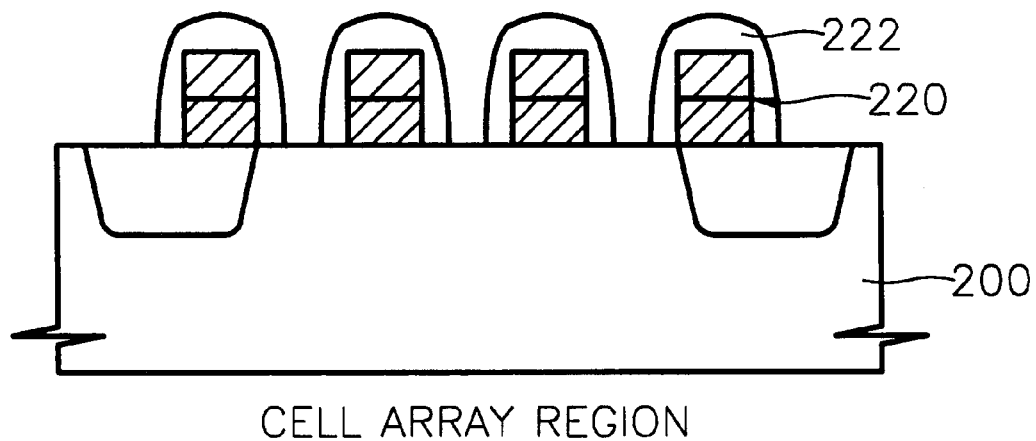
FIGS. 15a through 21b are section views illustrating a semiconductor memory device manufacturing method according to a second embodiment of the present invention.
Figure 15B:
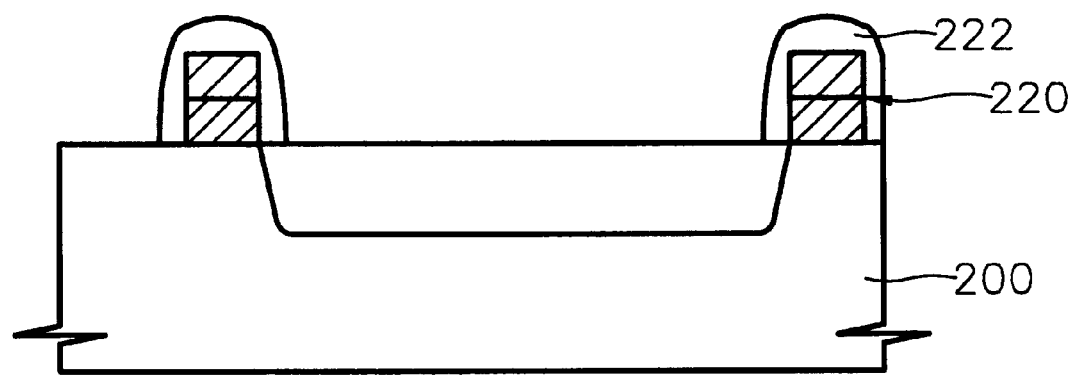

Referring to FIGS. 15a and 15b, in the cell array region and peripheral circuit region, a gate electrode 220 is formed on a semiconductor substrate 200 by a shallow trench isolation (STI) method, in which an isolation region and an active region is divided. The gate electrode 220 may be formed to have a polycide structure consisting of a polysilicon layer and a tungsten silicide layer. Here, the interval between the gate electrodes 220 is less than 0.5 μm in the cell array region while that in the peripheral circuit region may be several tens of μm. Then, a spacer 222 covering the gate electrode 220 is formed using a silicon nitride layer in a subsequent step in consideration of the etching selectivity of the silicon nitride layer to an oxide layer used as an ILD film. Then, a source/drain (not shown) is formed in the active region between the gate electrodes 220 in the cell array region by an ion implantation process, thereby completing a transistor consisting of the gate electrode 220 and the source/drain.

Figure 16A:
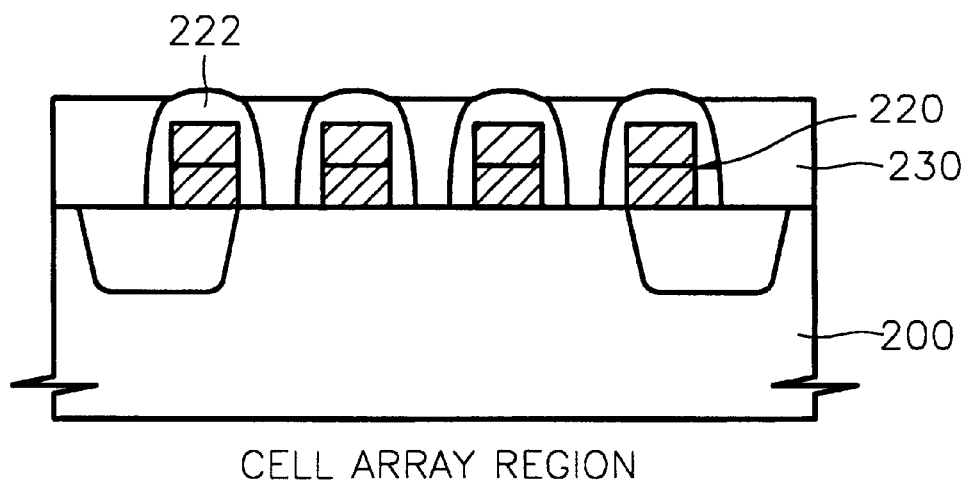
Figure 16B:
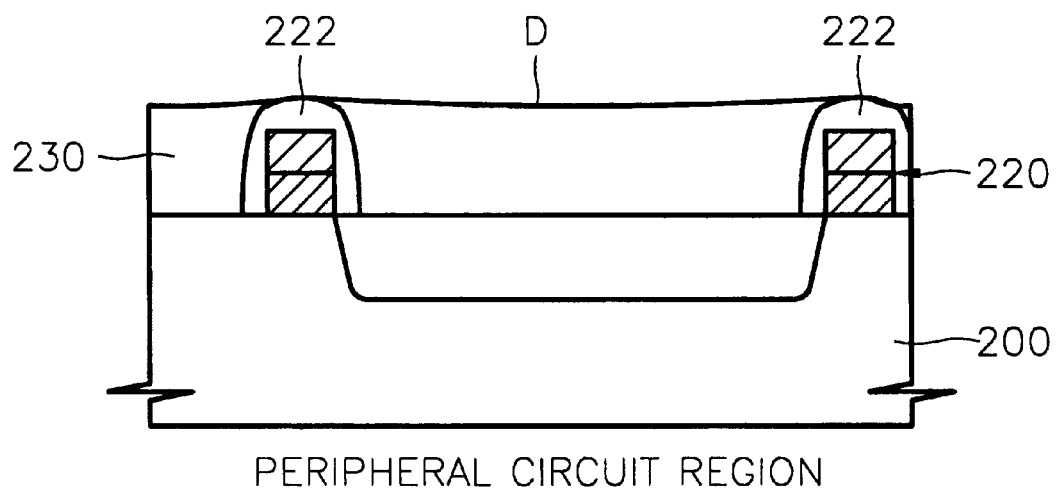

Referring to FIGS. 16a and 16b, in order to remove the step difference formed by the gate electrode 220 on the semiconductor substrate 200, BPSG is deposited on the resultant structure to a thickness of 4,000 Å or more, and then flowed at a higher temperature. Then, planarization is performed by a CMP process, using the spacer 222 as an etching end point, thereby forming a first ILD film 230. Here, since the gate electrodes 220 are formed with a narrower interval in the cell array region, dishing does not occur on the surface of the first ILD film 230 after the planarization using the CMP process. However, the interval between the gate electrodes 220 is comparatively wider in the peripheral circuit region, so that dishing represented by "D" in FIG. 16B, occurs on the surface of the first ILD film 230 after the CMP process.

Figure 17A:
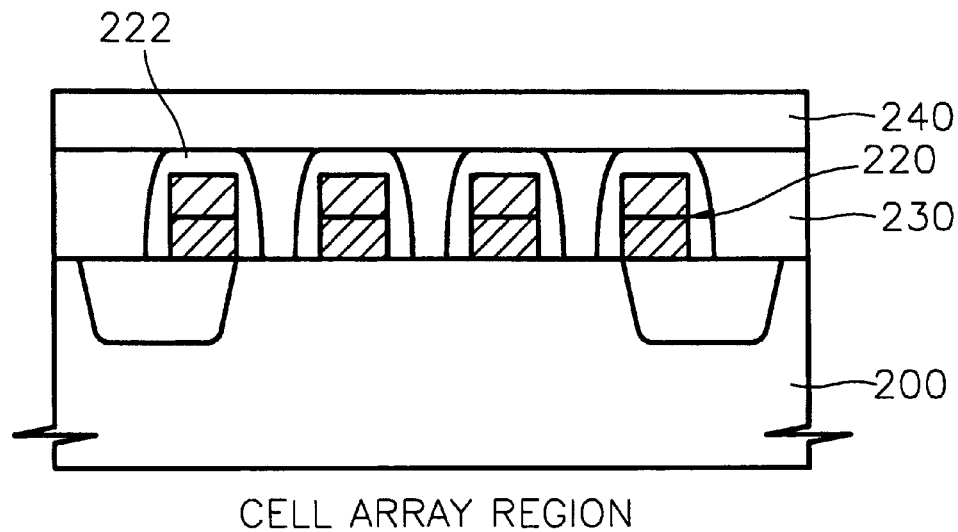
Figure 17B:
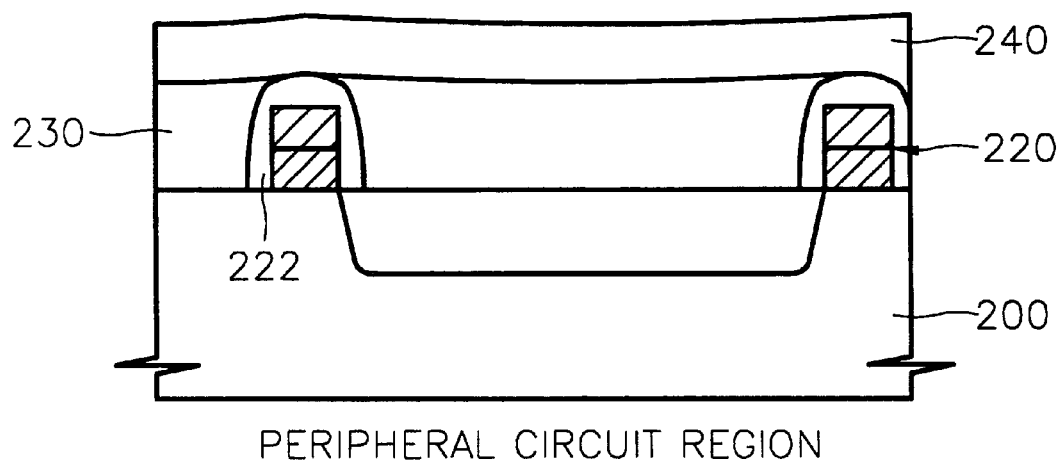

Referring to FIGS. 17a and 17b, in order to strengthen resistance of the first ILD film 230 to chemicals during a cleaning process, an oxide layer is deposited to a predetermined thickness on the first ILD film 230 to form a second ILD film 240. Here, dishing is reflected on the second ILD film 240 in the peripheral circuit region.

Figure 18A:
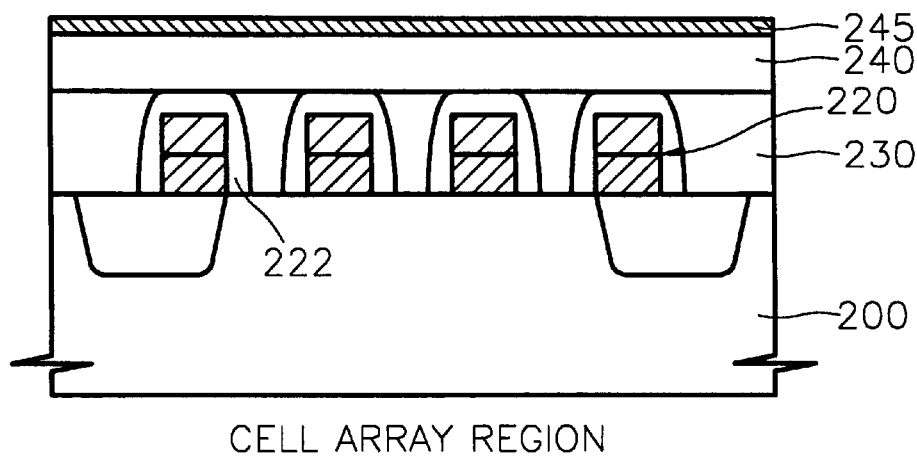
Figure 18B:
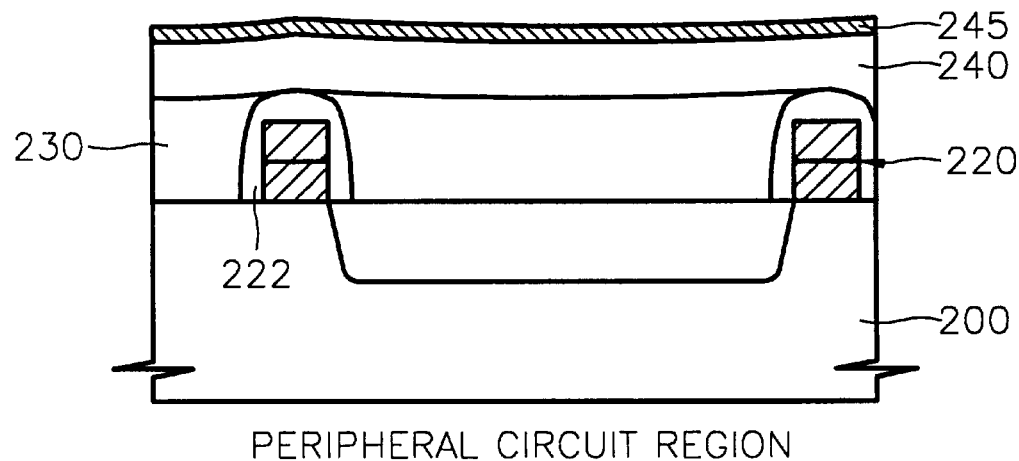

Referring to FIGS. 18a and 18b, impurity-undoped polysilicon material is deposited on the second ILD film 240 to a thickness of several hundred Å, to form a remaining preventing layer 245. The thickness of the remaining preventing layer 245 may differ according to the degree of dishing on the second ILD film 240, however, the thickness is preferably 200–1,000 Å. The impurity-undoped polysilicon forming the remaining preventing layer 245 is very rapidly etched compared to the impurity-doped polysilicon. Thus, when etching back the impurity-doped polysilicon layer in a subsequent step, no residue remains in the portion in which the dishing occured. Also, the remaining preventing layer 245 prevents diffused reflection of incident beams from the tungsten silicide layer of the gate electrode during a photolithography process for forming the contact, so that the deformation of a photoresist material is also prevented. Also, an increase in the contact size, caused by a poor etching selectivity between the photoresist material used for forming a contact in a subsequent step and the oxide layer forming the second ILD film 240, is prevented by the remaining preventing layer 245.

Figure 19A:
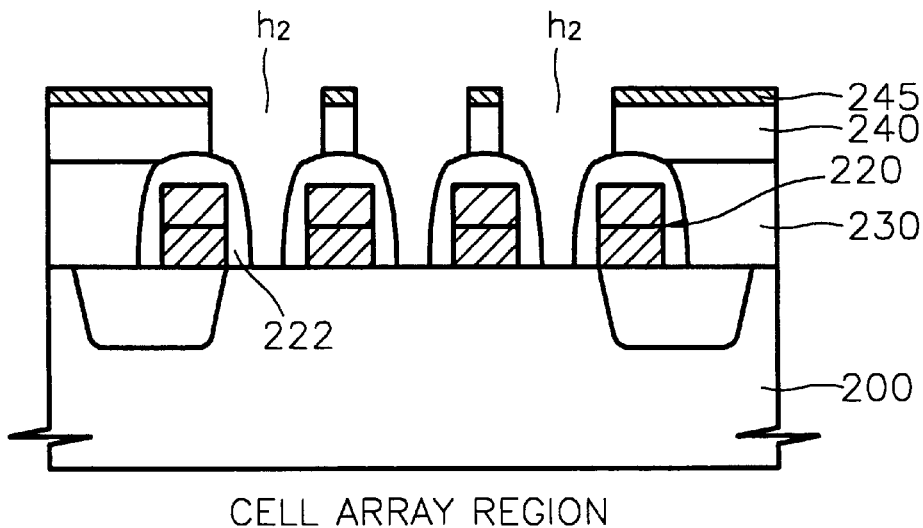
Figure 19B:
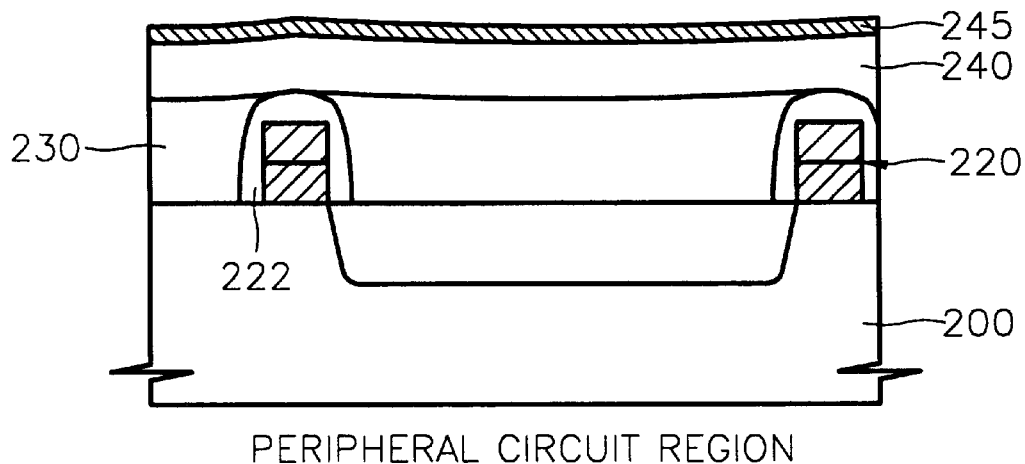

Referring to FIGS. 19a and 19b, in order to form a landing pad in the cell array region of the resultant structure having the remaining preventing layer 245, a landing pad hole $h_2$ is formed by sequentially etching the remaining preventing layer 245, the second ILD film 240 and the first ILD film 230 using a general photolithography process, such that the active region of the semiconductor substrate 200 and the spacer 222 are partially exposed at the same time. Here, the second ILD film 240 is etched using an equipment which provides excellent etching selectivity to the spacer 222 covering the gate electrode 220, such that the spacer 222 is protected and a short between the gate electrode 220 and the landing pad is prevented.

Figure 20A:
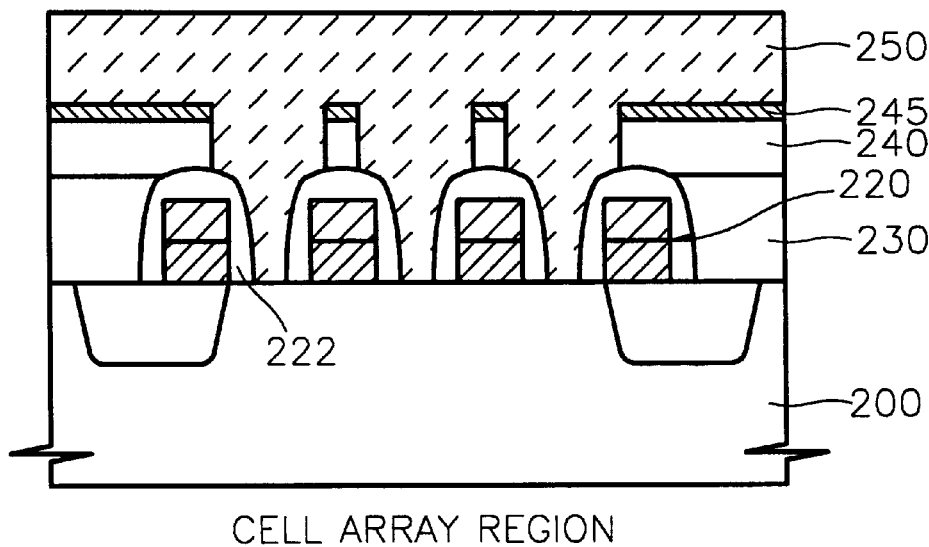
Figure 20B:
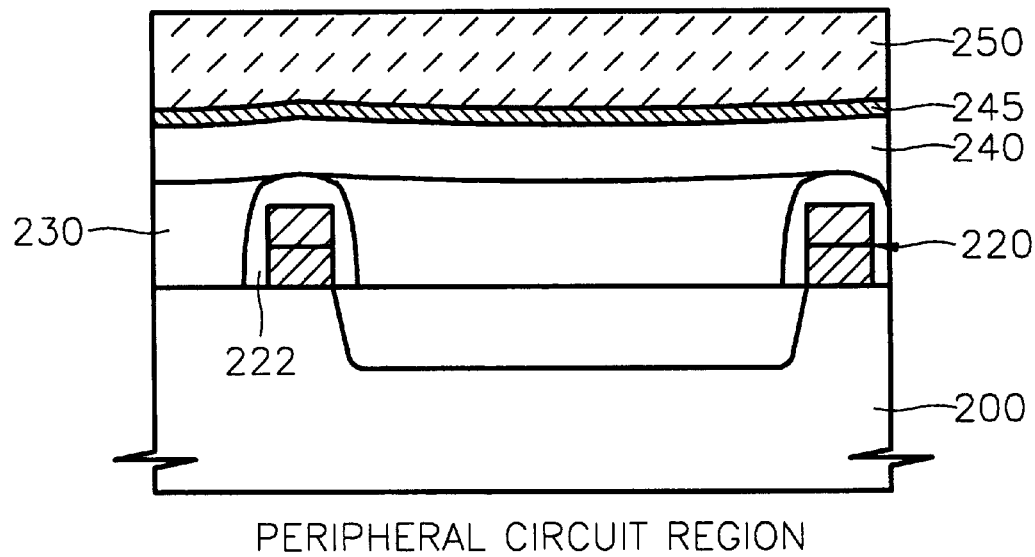

Referring to FIGS. 20a and 20b, a conductive layer 250 for forming a landing pad, e.g., an impurity-doped polysilicon layer, is deposited on the entire surface of the resultant structure having the landing pad hole $h_2$, to a thickness sufficient to completely bury the landing pad hole $h_2$.

Figure 21A:
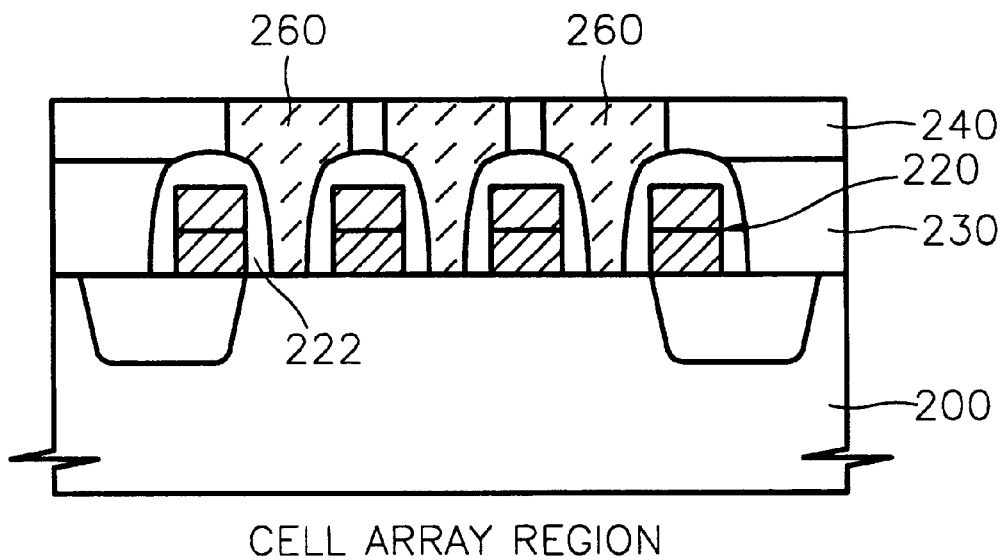
Figure 21B:
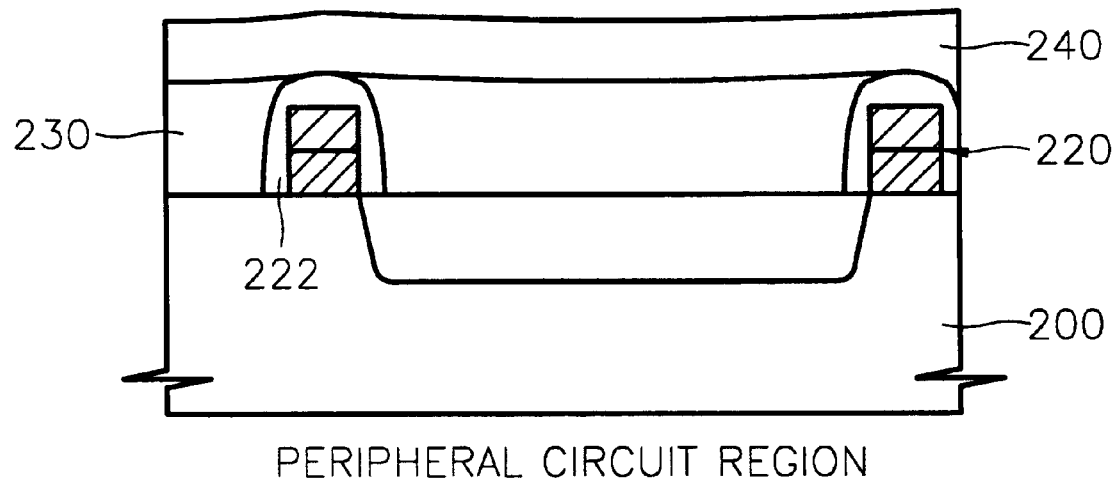

Referring to FIGS. 21a and 21b, a portion of the conductive layer 250 other than the portion formed in the landing pad hole $h_2$, and the remaining preventing layer 245 are all removed by a CMP process, thereby forming a landing pad 260 in a self-align manner. As a result, the remaining preventing layer 245 may remain in the peripheral circuit region in which dishing occurred. However, since the impurity-undoped polysilicon is removed by as much as 4~5 times faster than the impurity-doped polysilicon, the doped polysilicon material and the remaining preventing layer 245 are completely removed from all regions of the cell array region and peripheral circuit region except the landing pad 260. As a result, any remaining layer is not formed on the second ILD film 240.

Thereafter, a semiconductor memory device is completed by the same method as that of the first embodiment, illustrated with reference to FIGS. 9 through 14.

As described above, in the semiconductor memory device manufacturing method according to the second embodiment of the present invention, even though dishing occurs on the ILD film in the peripheral circuit region when the CMP process is performed for forming the landing pad, the unintended material on the ILD film, caused by the dishing, can be prevented from remaining.

Next, a semiconductor memory device manufacturing method according to the third embodiment of the present invention will be described.

FIGS. 22 through 28 are section views illustrating a semiconductor memory device manufacturing method according to third embodiment of the present invention.

Figure 22:
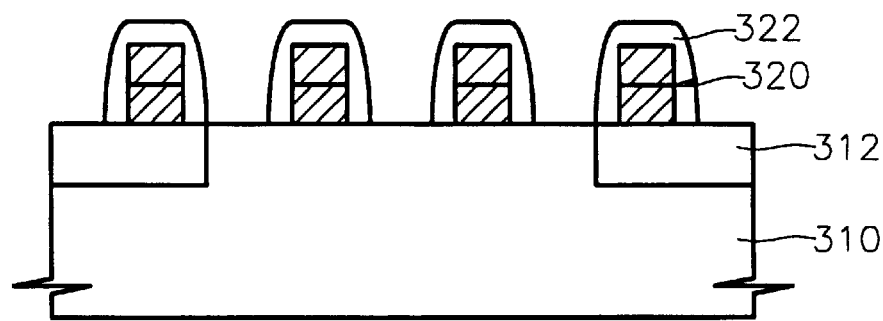
FIGS. 22 through 28 are section views illustrating a semiconductor memory device manufacturing method according to a third embodiment of the present invention.

Referring to FIG. 22, a gate electrode 320 is formed on a semiconductor substrate 310 by an STI method, in which an isolation region 312 and an active region are divided. The gate electrode 320 is formed to have a polycide structure consisting of, e.g., a polysilicon layer and a tungsten silicide layer. Then, a spacer 322 covering the gate electrode 320 is formed using a silicon nitride layer in a subsequent step in consideration of the etching selectivity of the silicon nitride layer to an oxide layer used as an ILD film. Then, a source/drain (not shown) is formed in the active region between the gate electrodes 320 in the cell array region by an ion implantation process, thereby completing a transistor consisting of the gate electrode 320 and source/drain.

Figure 23:
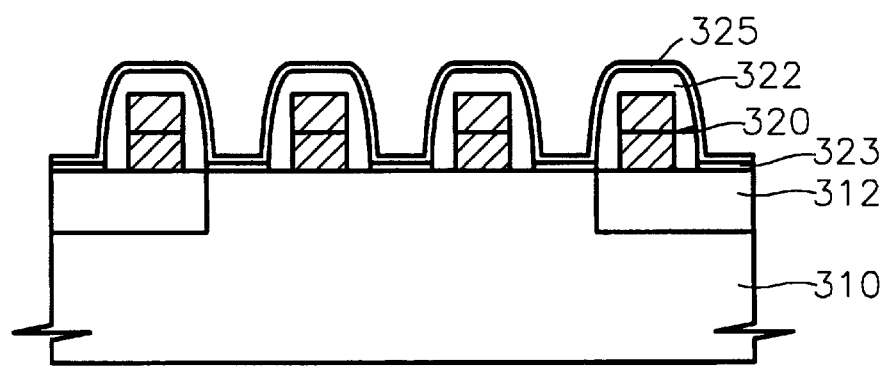

Referring to FIG. 23, in order to protect the surface of the active region of the semiconductor substrate 310, which is exposed during formation of the transistor, from an etch stop layer to be formed of a nitride layer in a subsequent step, a thermal oxide layer 323 is formed to a thickness of 50~150 Å on the semiconductor substrate 310. Then, an etch stop layer 325 made of silicon nitride is formed on the entire surface of the resultant structure having the thermal oxide layer 323 to a thickness of approximately 100 Å. In consideration of the etching selectivity to the oxide layer, the etch stop layer 325 is formed to a thickness at least 100 Å such that the space between the gate electrodes 320 is not buried.

Figure 24:
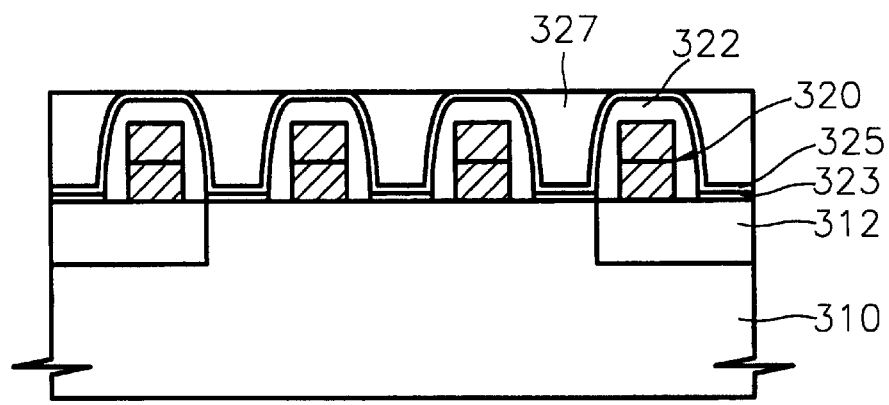

Referring to FIG. 24, a first oxide layer 327 is formed on the space between the gate electrodes 320 in the resultant structure having the etch stop layer 325. In a highly integrated semiconductor device, the distance between the gate electrodes is 0.15 $\mu$m or less. Thus, if a void exists in such small space, a short caused by the void occurs. Thus, it is important to fill the space between the gate electrodes without a void. To achieve this, a material having excellent flow characteristics, e.g., BPSG or spin-on glass (SOG), is first deposited on the resultant structure having the etch stop layer 325, to a thickness of approximately 1,000 Å, and the deposited layer is then etched at 45° angle to widen the opening between the gate electrodes 320. Then, BPSG or SOG is deposited thereon to a thickness of 5,000 Å, and then planarized by a flowing process, thereby resulting in a BPSG layer or an SOG layer. Then, the BPSG layer or the SOG layer is planarized by a CMP process, using the etch stop layer 325 as an etching end point, thereby completing the first oxide layer 327.

Figure 25:
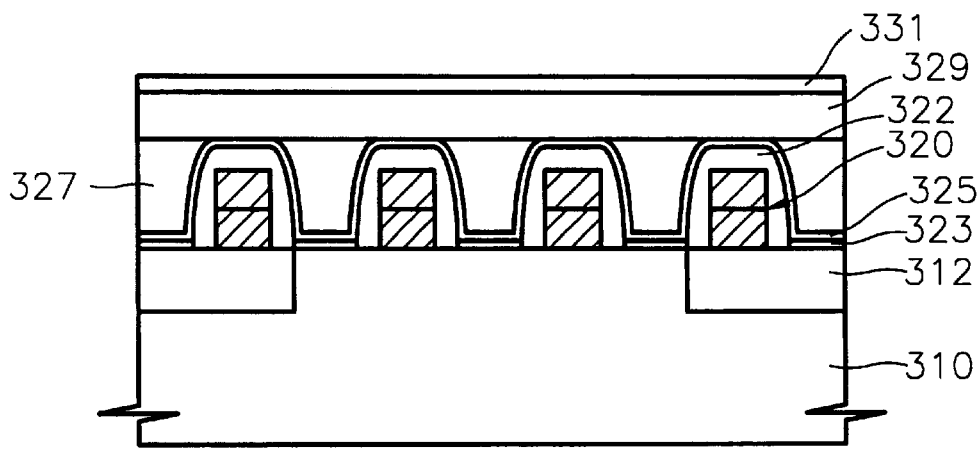

Referring to FIG. 25, a second oxide layer 329, e.g., a P-TEOS layer capable of being deposited at a lower temperature, is deposited on the entire surface of the resultant structure having the first oxide layer 327 to a thickness of approximately 2,000 Å. Also, in order to prevent the entrance of the landing pad hole from being widened during a subsequent etching process for forming a landing pad hole, a polysilicon layer is deposited to a thickness of approximately 500 Å.

Figure 26:
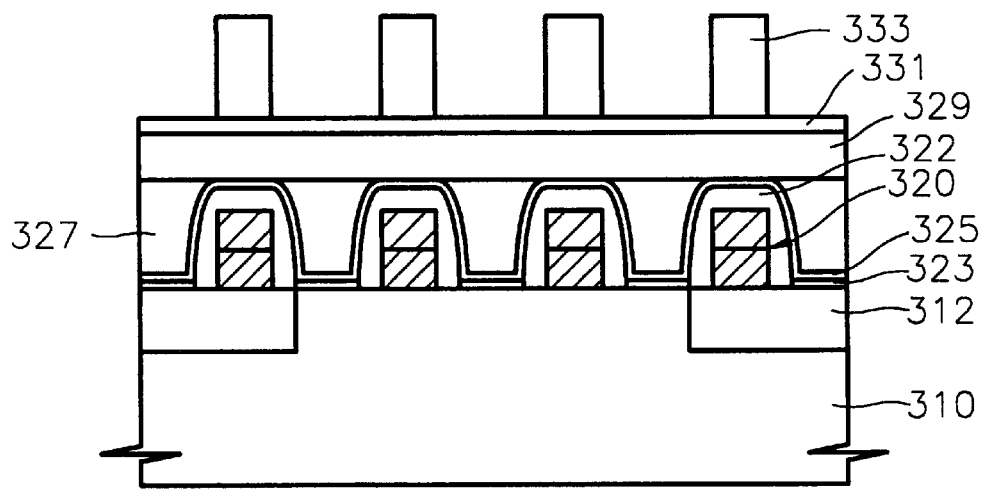

Referring to FIG. 26, a photoresist pattern 333 is formed on the polysilicon layer 331 to define a region in which a landing pad is to be formed.

Figure 27:
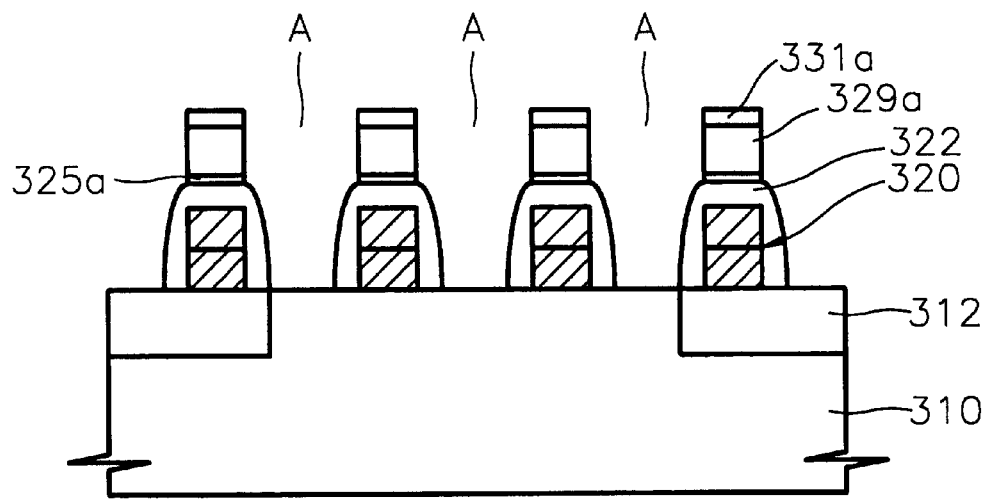

Referring to FIG. 27, the polysilicon layer 331, the second oxide layer 329, the first oxide layer 327, the etch stop layer 325 and the thermal oxide layer 323 are sequentially etched using the photoresist pattern 333 as a mask, thereby forming a polysilicon layer pattern 331a, a second oxide layer pattern 329a and an etch stop layer pattern 325. At the same time, a landing pad hole A which simultaneously exposes the surface of the semiconductor substrate 310 and the spacer 322 is formed. Here, even though a slight mis-alignment occurs in the etching process for forming the landing pad hole A, the etching process is performed under the condition for an oxide layer, so that the spacer 322 made of nitride and the surface of the semiconductor substrate 310 made of silicon are not damaged. Then, the photoresist pattern 333 is removed.

Figure 28:
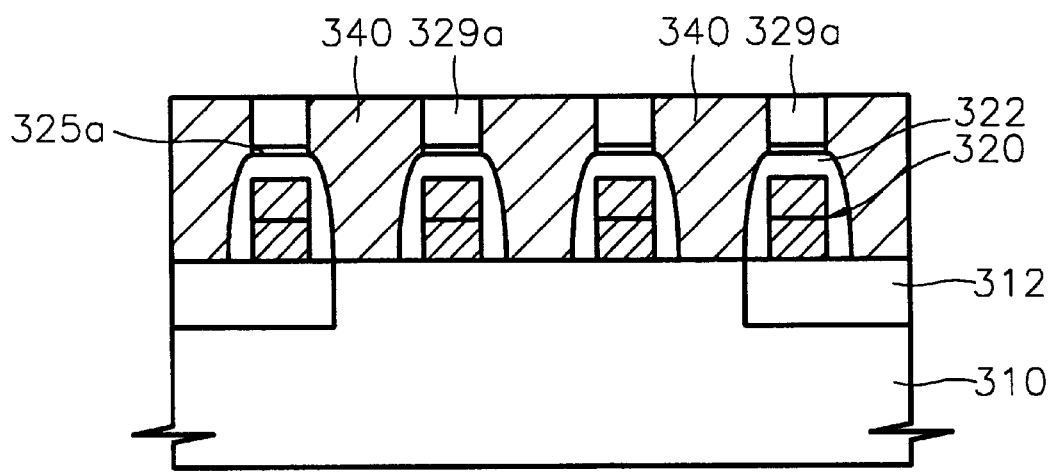

Referring to FIG. 28, a conductive layer, e.g., an impurity-doped polysilicon layer, is deposited on the resultant structure having the landing pad hole A, to a thickness sufficient to fill the landing pad hole A. Then, the conductive layer and the polysilicon layer pattern 331 are etched by a CMP process, using the second oxide layer pattern 329a as an etch stop layer, thereby forming a planarized landing pad 340 in the landing pad hole A.

Then, a semiconductor memory device is completed by the same method as that of the first embodiment, illustrated with reference to FIGS. 9 through 14.

According to the third embodiment of the present invention, a second oxide layer pattern formed in the space of each landing pad, using a P-TEOS, is repeatedly formed in the cell array region, and the second oxide pattern made of P-TEOS also exists in the region other than the cell array region, so that the surface of the semiconductor substrate is accurately planarized without dishing.

As described above, according to the embodiments of the present invention, a landing pad is formed by a patterning method so that a sufficient alignment margin can be secured without damaging the semiconductor substrate. Also, after a bit line contact pad is formed, a bit line is formed thereon, so that the step difference in the semiconductor substrate is minimized and the semiconductor substrate is planarized by a simpler process. As a result, the step difference between the cell array region and the peripheral circuit region is decreased to the thickness of a storage electrode.

While the present invention has been illustrated and described with reference to specific embodiments, further modifications and alterations will occur to those skilled in the art within the spirit and scope of this invention.

What is claimed is:

1. A method for manufacturing a semiconductor device comprising the steps of:
   (a) forming gate electrodes on a semiconductor substrate, the gate electrodes being covered with a nitride spacer;
   (b) forming an etch stop layer on the entire surface of the resultant structure of step (a) to an appropriate thickness such that the space between the gate electrodes is not buried;
   (c) forming a first interlayer dielectric (ILD) film covering the space between the gate electrodes and the top of the gate electrodes, the step of forming the first ILD film comprising the following steps:
      (c1) forming a first oxide layer on the resultant structure having the etch stop layer;
      (c2) etching the first oxide layer using the etch stop layer as an etch stop point to form a planarized first oxide layer; and
      (c3) forming a second oxide layer on the planarized first oxide layer;
   (d) patterning the first ILD film to form a landing pad hole which exposes the spacer and the etch stop layer;
   (e) removing the etch stop layer to expose the surface of the semiconductor substrate; and
   (f) filling the landing pad hole with a conductive material to form landing pads.

2. The method of claim 1, wherein the etch stop layer is formed of silicon nitride.

3. The method of claim 1, wherein the second oxide layer is formed by a chemical vapor deposition (CVD) method.

4. The method of claim 1, wherein the step (f) comprises the sub-steps of:
   (f1) forming a first conductive layer on the entire surface of the resultant structure having the landing pad hole; and
   (f2) etching the first conductive layer until the surface of the first ILD film is exposed, to form the landing pads in the landing pad hole.

5. The method of claim 4, wherein the first conductive layer is an impurity-doped polysilicon layer.

6. The method of claim 4, wherein the sub-step (f2) is performed by a chemical mechanical polishing (CMP) method.

7. The method of claim 4, wherein the sub-step (f2) is performed by etching back the first conductive layer.

8. The method of claim 1, further comprising, after the step (f), the steps of:
   (g) forming a second ILD film on the resultant structure having the landing pad;
   (h) patterning the second ILD film to form a bit line contact hole which exposes the surface of a part of the landing pads;
   (i) forming a bit line contact plug in the bit line contact hole; and
   (j) forming a bit line on the resultant structure of the step (i), the bit line connected to the bit line contact plug.

9. The method of claim 8, wherein the second ILD film is formed of borophosphosilicate glass (BPSG).

10. The method of claim 8, wherein the bit line contact plug is formed of an impurity-doped polysilicon.

11. The method of claim 8, wherein the step (j) comprises the sub-steps of:
   (j1) forming an amorphous tungsten silicide layer on the resultant structure having the bit line contact plug; and
   (j2) patterning the tungsten silicide layer to form the bit line.

12. The method of claim 8, further comprising, after the step (i), the steps of:
   (k) forming a third ILD film on the resultant structure having the bit line;
   (l) patterning the third ILD film to form a storage electrode contact hole which exposes the surface of the other part of the landing pads;
   (m) forming a storage electrode connected to the semiconductor substrate via the storage electrode contact hole and the other part of the landing pads;

(n) forming a dielectric film on the storage electrode; and (o) forming an upper electrode on the dielectric layer to complete a capacitor.

13. The method of claim 12, wherein the step (k) comprises the sub-step of forming an o₃-tetraethyl ortho silicate (TEOS) layer by an atmospheric pressure chemical vapor deposition (APCVD) method.

14. The method of claim 12, wherein the step (k) comprises the sub-steps of:

(k1) forming a plasma type oxide layer;

(k2) forming a BPSG layer on the plasma type oxide layer; and (k3) reflowing the BPSG layer.

15. The method of claim 12, wherein the storage electrode is formed of an impurity-doped polysilicon.

16. The method of claim 12, wherein the step (n) comprises the sub-steps of:

(n1) forming a nitride layer on the storage electrode;

(n2) heating the resultant structure of the step (o1) in a nitrogen atmosphere; and (n3) performing an oxidation process on the resultant structure heated to 750° C. or more, to form the dielectric film having a nitride/oxide structure.

17. A method for manufacturing a semiconductor device comprising the steps of:

(a) forming a gate electrode on a semiconductor substrate having a cell array region and a peripheral circuit region, the gate electrode being covered with a spacer;

(b) forming a planarized first interlayer dielectric (ILD) film on the semiconductor substrate having the gate electrode;

(c) forming a second ILD film on the first ILD film;

(d) forming a remaining preventing layer on the second ILD film, the remaining preventing layer having a first etching rate;

(e) patterning the remaining preventing layer, the second ILD film and the first ILD film in sequence to form a landing pad hole which simultaneously exposes an active region of the semiconductor substrate, and a part of the spacer in the cell array region; and (f) forming a landing pad in the landing pad hole, the landing pad having a second etching rate that is less than the first etching rate.

18. The method of claim 17, wherein the spacer is formed of nitride.

19. The method of claim 17, wherein the first ILD film is formed of borophosphosilicate glass (BPSG).

20. The method of claim 17, wherein the first ILD film is planarized by a chemical mechanical polishing (CMP) method.

21. The method of claim 17, wherein the second ILD film is formed of an oxide.

22. The method of claim 17, wherein the remaining preventing layer is formed of an impurity-undoped polysilicon.

23. The method of claim 22, wherein the remaining preventing layer is formed to a thickness of 200~1,000 Å.

24. The method of claim 17, wherein the step (f) comprises the sub-steps of:

(f1) depositing an impurity-doped polysilicon on the entire surface of the resultant structure having the landing pad hole to a thickness sufficient to fill the landing pad hole;

(f2) removing the impurity-doped polysilicon of the portion exclusive of the inside of the landing pad hole, and the remaining preventing layer to form the landing pad in the landing pad hole.

25. The method of claim 24, wherein the step (f2) is performed by a chemical mechanical polishing (CMP) method.

26. A method for manufacturing a semiconductor device comprising the steps of:

(a) forming gate electrodes on a semiconductor substrate, the gate electrodes being covered with a nitride spacer;

(b) forming an etch stop layer on the entire surface of the resultant structure of the step (a) to an appropriate thickness such that the space between the gate electrodes is not buried;

(c) forming a first oxide layer in the space between the gate electrodes;

(d) forming a second oxide layer on the first oxide layer;

(e) forming a polysilicon layer on the second oxide layer;

(f) partially etching the polysilicon layer, the second oxide layer, the first oxide layer, and the etch stop layer in sequence, to form a landing pad hole which simultaneously exposes the surface of the semiconductor substrate and a part of the spacer;

(g) forming a conductive layer to a thickness sufficient to fill the landing pad hole; and (h) etching the conductive layer and the polysilicon layer using the second oxide layer as an etch stop layer to form a landing pad in the landing pad hole.

27. The method of claim 26, wherein the etch stop layer is formed of silicon nitride.

28. The method of claim 26, wherein the step (c) comprises the sub-steps of:

(c1) depositing a first oxide having flowable characteristics on the resultant structure having the etch stop layer;

(c2) etching the deposited oxide at an angle to widen the entrance between the gate electrodes;

(c3) depositing a second oxide having flowable characteristics on the oxide etched at an angle;

(c4) planarizing the resultant structure of the sub-step (d3) by a flowing process, to form a planarized oxide layer; and (c5) planarizing the planarized oxide layer by a chemical mechanical polishing (CMP) method, using the etch stop layer as an etching end point.

29. The method of claim 28, wherein the first and second oxides are comprised of at least one selected from the group consisting of borophosphosilicate glass (BPSG) and spin-on glass (SOG).

30. The method of claim 26, wherein the second oxide layer is a P-TEOS layer formed at a relatively low temperature.

31. The method of claim 26, wherein the conductive layer is formed of an impurity-doped polysilicon.

32. The method of claim 26, wherein the step (h) is performed by a chemical mechanical polishing (CMP) method.

33. The method of claim 1, further comprising, prior to the step (b), the step of:

forming a thermal oxide layer on the exposed surface of the semiconductor substrate between the gate electrodes.

34. The method of claim 26, further comprising, prior to the step (b), the step of:

forming a thermal oxide layer on the exposed surface of the semiconductor substrate between the gate electrodes.

* * * * *